(12) United States Patent
Kikuchi et al.

(10) Patent No.: US 6,385,758 B1
(45) Date of Patent: May 7, 2002

(54) SYSTEM AND METHOD FOR COMPACTING A GRAPHIC LAYOUT

(75) Inventors: Hideo Kikuchi; Takeshi Shimotsu, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/275,076

(22) Filed: Mar. 24, 1999

(30) Foreign Application Priority Data

Mar. 24, 1998 (JP) ............................................ 10-076176

(51) Int. Cl.$^7$ .............................................. G06F 17/50
(52) U.S. Cl. ......................................................... 716/2
(58) Field of Search ............................. 716/5, 7, 12, 1, 716/2, 9, 11

(56) References Cited

U.S. PATENT DOCUMENTS

| | | | | |
|---|---|---|---|---|
| 5,633,807 A | * | 5/1997 | Fishburn | 716/12 |
| 6,006,024 A | * | 12/1999 | Guruswamy | 716/12 |

FOREIGN PATENT DOCUMENTS

| | | |
|---|---|---|
| JP | 62-78681 | 4/1987 |
| JP | 63-181349 | 7/1988 |
| JP | 63-214880 | 9/1988 |
| JP | 1-279373 | 11/1989 |
| JP | 5-274392 | 10/1993 |
| JP | 6-195420 | 7/1994 |
| JP | 9-204461 | 8/1997 |
| JP | 10-3491 | 1/1998 |

OTHER PUBLICATIONS

W. Yamamoto et al., "A Chip Compaction Method on Constraint Graph and the Experimental Result", Technial Report of IEICE VLD91–43 (1991), pp. 41–48.

W. Yamamoto et al., "A Chip Spacing Method for layouts with Design–Rule Violations", Technical Report of IEICE VLD91–120, Feb. 7, 1992, pp. 37–44.

W. Yamamoto et al., "A Chip Spacer with Automatic 45° Diagonal Wiring Generation", Technical Report of IEICE VLD91–123, (1992), pp. 17–24.

H. Shin et al., "Two–Dimensional Compaction by Zone Refining", Proc. of 23$^{rd}$ Design Automation Conference, (1986), pp. 115–122 with Abstract.

K. Sakanushi et al., "Concurrent Representation and Optimization of Placement and Route on BSG", Technical Report of IEICE, VLD97–40, (Jun. 1997), pp. 175–182 with Abstract.

* cited by examiner

Primary Examiner—Matthew Smith
Assistant Examiner—Thuan Do
(74) Attorney, Agent, or Firm—Sughrue Mion, PLLC

(57) ABSTRACT

In a graphic layout system, a terminal constraint graph generator (104) prepares terminal constraint graph data with component terminals (except routes) as one and the other nodes. Calculation is made of a limit of movement of the one node towards the other node in a moving direction with a routing zone interposed therebetween. The routing zone has a width equal to a sum of the width of a route or routes in the routing zone and a necessary gap. The limit of movement is memorized as a component relative movement limit length. The terminal constraint graph generator (104) prepares component constraint graph data recording as a graph length a minimum value of the component relative movement limit length with respect to the same component terminals. By the use of the component constraint graph data, a component compactor (107) compacts the arrangement of components.

28 Claims, 27 Drawing Sheets

FIG.6A SEGMENT DATUM (TERMINAL AND VIA HOLE)

- 31 SEGMENT NUMBER
- 32 COMPONENT NUMBER
- 36 CONFIGURATION NUMBER
- 33 POSITION NUMBER
- 37 SIGNAL NAME

FIG.6B SEGMENT DATUM (ROUTE AND POLYGONAL CONDUCTOR CONFIGURATION)

- 31 SEGMENT NUMBER
- 36 CONFIGURATION NUMBER
- 33 POSITION NUMBER (1ST END)
- 33 POSITION NUMBER (2ND END)
- 37 SIGNAL NAME
  INDICATION OF FIXED OR
  DEFORMABLE CONFIGURATION

FIG.6C 34 POSITION DATUM

- 33 POSITION NUMBER
  X COORDINATE VALUE
  Y COORDINATE VALUE
  LAYER PLANE NUMBER
- 32 COMPONENT NUMBER

FIG.6D 35 CONFIGURATION DATUM

- 36 CONFIGURATION NUMBER
  PATTERN WIDTH IN LONGITUDINAL DIRECTION
  PATTERN WIDTH IN LATERAL DIRECTION
  WIDTH IN 1ST DIAGONAL DIRECTION
  WIDTH IN 2ND DIAGONAL DIRECTION

FIG.6E ROUTING LIMIT POSITION DATUM

- 31 SEGMENT NUMBER OF ROUTE
- 31 SEGMENT NUMBER OF COMPONENT TERMINAL
- 36 CONFIGURATION NUMBER OF ROUTING RESTRAINT AREA
- 33 POSITION NUMBER OF COMPONENT TERMINAL

CONSTRAINT GRAPH DATUM

FIG.7A

| | |
|---|---|
| 61 | DIRECTION OF GRAPH |
| 31 | SEGMENT NUMBER OF 1ST NODE IN GRAPH |
| 31 | SEGMENT NUMBER OF 2ND NODE IN GRAPH |

TERMINAL CONSTRAINT GRAPH DATUM

FIG.7B

| | |
|---|---|
| 61 | DIRECTION OF GRAPH |
| 31 | COMPONENT TERMINAL SEGMENT NUMBER OF 1ST NODE IN GRAPH |
| 31 | COMPONENT TERMINAL SEGMENT NUMBER OF 2ND NODE IN GRAPH |
| 62 | RELATIVE MOVEMENT LIMIT LENGTH |
| 52 | ROUTE BANDWIDTH |
| | ROUTE NUMBERS BETWEEN GRAPH n |
| 31 | SEGMENT NUMBER OF 1ST ROUTE |
| 31 | SEGMENT NUMBER OF 2ND ROUTE |
| | ... |
| 31 | SEGMENT NUMBER OF n-TH ROUTE |

53 SEED TERMINAL GRAPH DATUM

FIG.7C

| | |
|---|---|
| 61 | DIRECTION OF GRAPH |
| 31 | SEGMENT NUMBER OF GRAPH SEED |
| 52 | ROUTE BANDWIDTH |
| | WIDTH OF ROUTING RESTRAINT AREA |
| | THE NUMBER m OF SHIELD REGIONS |
| | WIDTH OF 1ST SHIELD REGION |
| | ... |
| | WIDTH OF m-TH SHIELD REGION |
| | ROUTE NUMBERS BETWEEN GRAPH n |
| 31 | SEGMENT NUMBER OF 1ST ROUTE |
| 31 | SEGMENT NUMBER OF 2ND ROUTE |
| | ... |
| 31 | SEGMENT NUMBER OF n-TH ROUTE |

COMPONENT CONSTRAINT GRAPH DATUM

FIG.7D

| | |
|---|---|
| 61 | DIRECTION OF GRAPH |
| 32 | COMPONENT NUMBER OF 1ST NODE IN GRAPH |
| 32 | COMPONENT NUMBER OF 2ND NODE IN GRAPH |
| 51 | TERMINAL CONSTRAINT GRAPH NUMBER (AS A NECK) |
| 62 | COMPONENT RELATIVE MOVEMENT LIMIT LENGTH |

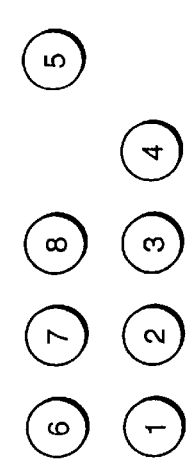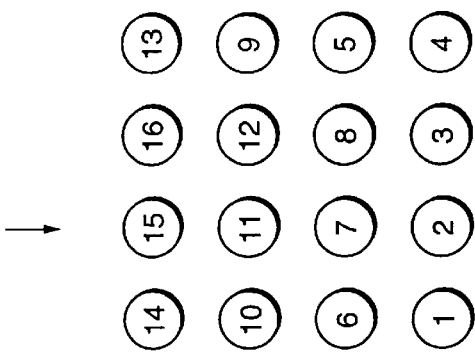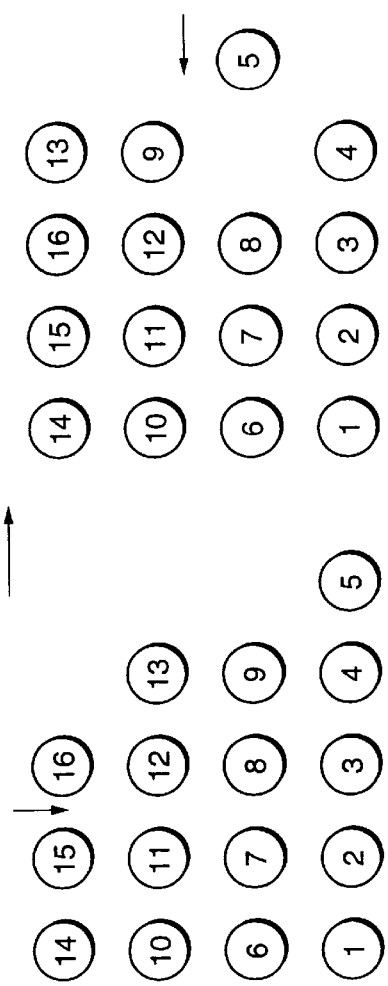

SYSTEM AND METHOD FOR COMPACTING A GRAPHIC LAYOUT

BACKGROUND OF THE INVENTION

This invention relates to a graphic layout compaction system and a graphic layout compaction method.

An automatic layout system is utilized for designing a layout of a large-scale semiconductor integrated circuit or a printed-circuit board. The large-scale semiconductor integrated circuit includes a lot of semiconductor cells. The printed-circuit board mounts a lot of parts thereon. The semiconductor cells may be merely referred to cells. The semiconductor cells and the parts are collectively called components in the present specification. Although each component has at least one terminal which is called a component terminal, the component terminal may be called the component. In addition, in the automatic layout system of the type, various compaction techniques for moving components with the components linked are already proposed.

A conventional graphic compaction system is disclosed in Japanese Unexamined Patent Publication (JP-A) No. 9-204461 (204461/1997) (Publication 1). In this system, the layout of a plurality of components is compacted with relative position relationship of the components held. However, this graphic compaction system is disadvantageous in that it is impossible to compact a pattern having routes or wires between component terminals. This is because this graphic compaction system places or arranges only the parts (the components) on a printed-circuit board in a stage prior to routing or wiring between terminals (the component terminals) of the parts and then compacts its placement or arrangement.

Another conventional graphic compaction system is disclosed in Japanese Unexamined Patent Publication (JP-A) No. 1-279373 (279373/1989) (Publication 2). The graphic compaction system compacts semiconductor cells (the components) and routes or wires in a stage after routing or wiring between terminals (the component terminals) of cells on designing of an integrated circuit.

As disclosed in Japanese Unexamined Patent Publications (JP-A) Nos. 62-78681 (78681/1987) (Publication 3) and 63-214880 (214380/1988) (Publication 4), compaction of the routes or wires together with semiconductor cells or parts (components) frequently adopts a scheme using a constraint graph. For the compaction using the constraint graph, proposal is made of a jog insertion compaction technique by W. Yanamoto et al in their articles "A Chip Compaction Method on Constraint Graph and the Experimental Result", Technical Report of IEICE VLD91-43, pp. 41—48, 1991 (Article 1), "A Chip Spacing Method for layouts with Design-Rule Violations", Technical Report of IEICE VLD91-120, pp. 37–44, Feb. 7, 1992 (Article 2), and "A Chip Spacer with Automatic 45° Diagonal Wiring Generation", Technical Report of IEICE VID91-123, pp. 17–24, 1992 (Article 3). The jog insertion compaction technique modifies structure of the constraint graph by inserting a bend part called "jog" in the routing or wiring to thereby enable to reduce an area of the layout and to correct places with design-rule violations.

Referring to FIG. 1, a conventional layout compaction system comprises a cell placement processing unit (cell arrangement processing unit) 710, an inter-cell routing processing unit 720, a longest route searching unit 730, a layout enlarging unit 740, a layout correction designating unit 750, an automatic layout compressing unit (compaction unit) 760, a layout data memory 770, and a layout result display unit 780.

The conventional layout compaction system having such structure operates in a following manner.

The cell placement processing unit 710 carries out processing of placement or arrangement for cells as known in the art and stores cell layout data indicative of a layout of the cells in the layout data memory 770.

As known in the art, the inter-cell routing processing unit 720 carries out processing of routing or wiring between cells and stores routing layout data (wiring layout data) indicative of a layout of the routing or the wiring in the data Emory 770.

The longest route searching unit 730 searches a series of graphic elements having the longest route in the layout stored in the layout data memory 770 in order to compact a layout of each cell and the routing or wiring on an LSI chip into a smaller area and displays it in the layout data memory 770 and displays the longest route in the layout result display 780 as depicted by oblique lines in FIG. 2A.

As illustrated in FIG. 2B, the layout enlarging unit 740 inserts a space crossing the longest route of its constraint graph in the layout as shown in FIG. 2B.

Responsive to a request from an operator, the layout correction designating unit 750 moves a particular part from the longest route of the constraint graph so as to shorten the longest route. In the example illustrated in FIG. 2B, the particular part is the second part from a lower end and is moved rightward.

The automatic layout compressing unit (compaction unit) 760 compacts the layout indicative of a corrected result in up and down of FIG. 2B.

However, in a case of carrying out the compaction of the layout BO as to reduce the layout in both longitudinal and lateral directions, the conventional compactor 760 reduces the layout in two steps so as to first reduce it in one direction (e. g. the longitudinal direction) and to subsequently reduce it in another direction (e. g. the lateral direction). Therefore, when the layout is first reduced in the longitudinal direction, the cells or the components crowd in the longitudinal direction and it results in preventing reduction of placement or arrangement of the cells or the components and the layout of the routing or the wiring in the lateral direction.

In addition, those skilled in the art may hit upon a method comprising the steps of extending the Dijkstra method, of simultaneously evaluating a movable distance of the longitudinal direction and another movable distance of the lateral direction for each part or component, and of moving the parts or the components in order ascending the movable distances in its direction to place or arrange the parts or the components. However, this method is disadvantageous in that placement or arrangement of the parts or the components crowded in a particular direction selected from the longitudinal direction and the lateral direction prevents the parts or the components from subsequently moving in a direction perpendicular to the particular direction.

The reason for this defect is as follows. This conventional compaction system carries out compaction of the layout so as to first move all of the parts or the components pushed to touch a substrate end and to subsequently move all of the parts or the components pushed to touch the substrate end. Therefore, an initial result of placement or arrangement for semiconductor cells or parts is not reflected to the layout after compaction and compaction in an initial direction results in unbalancing placement or arrangement of the parts or the components. As a result, compaction of the semiconductor cells or the parts in the next direction is prevented.

In addition, to improve this defect, still another conventional graphic compaction system is disclosed in Japanese Unexamined Patent Publication (JP-A) No. 63-181349 (181349/1988) (Publication 5). The graphic compaction system moves semiconductor cells in a symmetrical direction towards a center of the layout for a chip before routing or wiring process for an LSI, compacts the layout so that the semiconductor cells collect in a center direction of the chip, and makes routing or wiring between the semiconductor cells.

However, the compaction system described in Publication 5 divides an area of the layout about the center of the chip into four divided areas and carries out compaction in the respective divided areas. In addition, in each divided area, the compaction system carries out primary compaction of the semiconductor cells in a first direction and subsequently carries out secondary compaction of the semiconductor cells in a second direction perpendicular to the first direction. As a result, a result of the primary compaction may prevent the semiconductor cells from moving in the second direction in the secondary compaction.

The reason for this defect is as follows. That is, the conventional compaction system carries out compaction of the layout so as to move the layout in a predetermined designated direction in spite of moving the semiconductor cells (the parts) either in the longitudinal direction or in the lateral direction. As a result, when a difficulty occurs in the designated direction for moving the parts or the components, movement of the parts or the components is prevented.

In order to remove this defect, two-dimensional compaction is proposed in E. Shin et al "Two-Dimensional Compaction by Zone Refining", Proc. of 23rd Design Automation Conference, 1986, pp. 115–122 (Article 4). The two-dimnsional compaction is a technique in which a component is moved simultaneously in two directions. Specifically, constraint graphs in longitudinal and lateral directions are prepared and semiconductor cells are successively moved downward in the longitudinal direction. Each cell is moved simultaneously in the longitudinal and the lateral directions to be located at an appropriate position. Routing are carried out by pulling the route or wire downward with folds or jogs produced therein.

In Japanese Unexamined Patent Publication (JP-A) 5-274392 (274392/1993) (Publication 6), a different conventional graphic compaction system is disclosed which includes a pattern division section for dividing a substrate into a plurality of partial areas each having routing or wiring as a boundary and a plurality of partial pattern compression sections for the respective partial areas. The partial pattern compression sections compress the shape of the partial areas in the substrate to the left or right from a left-hand end of the substrate and compress the shape of the partial areas in the substrate to up and down from an upper end of the substrate. Therefore, the graphic compaction system uniformly compacts the entire area of the substrate with relationship up and down and left and right in the area maintained.

In addition, a method based on the Bounded Sliceline-Grid (BSG) is proposed which comprises the step of designating a rectangular area enclosing parts by the BSG and the step of concurrently compacting the area in the longitudinal and lateral directions by changing a size of the area (K. Sakanushi et al "Concurrent Representation and Optimization of Placement and Route on BSG", Technical Report of IEICE, VIM97-40, pp. 175–182, June 1997 (Article 5)).

In the above-mentioned conventional techniques, it is possible to compress the partial areas of the substrate by two-dimensional compaction or partial compaction. However, the routes (or wires) must be arranged in the longitudinal and the lateral directions. By compressing the routes (or wires) in the longitudinal and the lateral directions, the partial areas are compressed. Thus, diagonal routes or wires can not be used.

Japanese Unexamined Patent Publication (JP-A) 10-3491 (3491/1998) (Publication 7) discloses a technique of erasing all of existing routes or wires and arranging new routes or wires simultaneously with compaction. In this technique, diagonal routes or wires can be used.

In Publication 7, however, the routes or wires are pulled in a compaction direction and closely gathered. Therefore, it is difficult to reserve a sufficient space between the routes or wires so as to suppress occurrence of crosstalk therebetween.

Upon compaction of a layout with routes or wires connected among a large number of component terminals in a printed-circuit board, it is difficult in any one of the conventional techniques described above to move all component terminals of multi-terminal components with the wires connected therebetween.

Throughout the instant specification, technical terms may be defined as follows. Components may comprise either parts on a printed-circuit board or semiconductor cells in a large-scale semiconductor circuit. Each component has one or more component terminals which may be called the component. A layout comprises at least one layer of pattern. The pattern comprises routes or wires, terminals, via holes, and polygonal conductor configurations which are placed or arranged on a two-dimensional space. Each of the terminals, the via holes, and the polygonal conductor shapes may be also called the component terminal. Accordingly, the layout comprises the routes or the wires and the component terminals or the components. A graph consists of nodes and edges for connecting between the nodes. The nodes are also called vertices. The edges are also called branches.

SUMMARY OF THE INVENTION

It is therefore an object of this invention to provide a system and a method for graphic layout compaction, which is capable of preventing interference between compaction in a first direction and compaction in a second direction perpendicular to the first direction.

It is another object of this invention to provide a system and a method for graphic layout compaction, which is capable of modifying an arrangement of a component as an obstacle against compaction to achieve a small layout area.

It is still another object of this invention to provide a system and a method for graphic layout compaction, which is capable of maintaining a positional relationship between components in longitudinal and lateral directions by determining a moving distance of each component so that the layout of the components is uniformly compressed.

A graphic layout compaction system to which this invention is applicable is for use in compacting a pattern of at least one layer including wires, component terminals, via holes, and polygonal conductor configurations (or shapes). According to this invention, the graphic layout compaction system is supplied with layout data to divide the component terminals and the via holes into segment data per layer and to divide the routes (or wires) and the polygonal conductor shapes into segment data per bending point and branching point. These segment data linked to each other are assigned with a common component number. Herein, each individual via hole is represented by a single component number (hereinafter, each via hole will also be called a component).

The graphic layout compaction system comprises a terminal constraint graph generator for preparing terminal constraint graph data and component constraint graph data representative of (a) a pair of adjacent component terminals adjacent in a longitudinal or a lateral direction in each layer and (b) a limit movable distance within which one of the adjacent component terminals is allowed to move towards the other adjacent component terminal with a routing (wiring) zone including routes (wires) and a necessary gap interposed therebetween, a compactor for compacting the components with reference to the component constraint graph data, and a rerouting unit for shaping and rearranging the routes (wires).

To avoid interference between compaction in a first direction and compaction in a second direction perpendicular to the first direction, a particular component resulting in the interference is modified in its position to thereby narrow a layout area.

A movable distance of each component is determined so that the arrangement of the components is uniformly compacted. Thus, compaction is carried out in the manner such that a positional relationship between the components in longitudinal and lateral directions is maintained. It is thus possible to prevent occurrence of the interference upon compaction.

The terminal constraint graph generator prepares the terminal constraint graph data with the component terminals (except the routes) included as nodes. Calculation is made of the limit movable distance within which one node is movable towards the other node in a moving direction via the routing zone including the routes and the necessary gap interposed therebetween. The limit movable distance is memorized as a component relative movement limit length. The terminal constraint graph generator prepares the component constraint graph data having a graph length which is a minimum value of the component relative movement limit length with respect to the one component terminal. The component compactor compacts the arrangement of the components with reference to the component constraint graph data.

BRIEF DESCRIPTION OF THE DRAWING

FIGS. 6A through 6E are views showing various kinds of data used in the graphic layout compaction system in FIG. 3;

FIGS. 7A through 7D are views showing other various kinds of data used in the graphic layout compaction system in FIG. 3;

FIGS. 20A through 20C are views for describing a specific example of operation of the graphic layout compaction system illustrated in FIG. 14;

DESCRIPTION OF PREFERRED EMBODIMENTS

Figure 1:
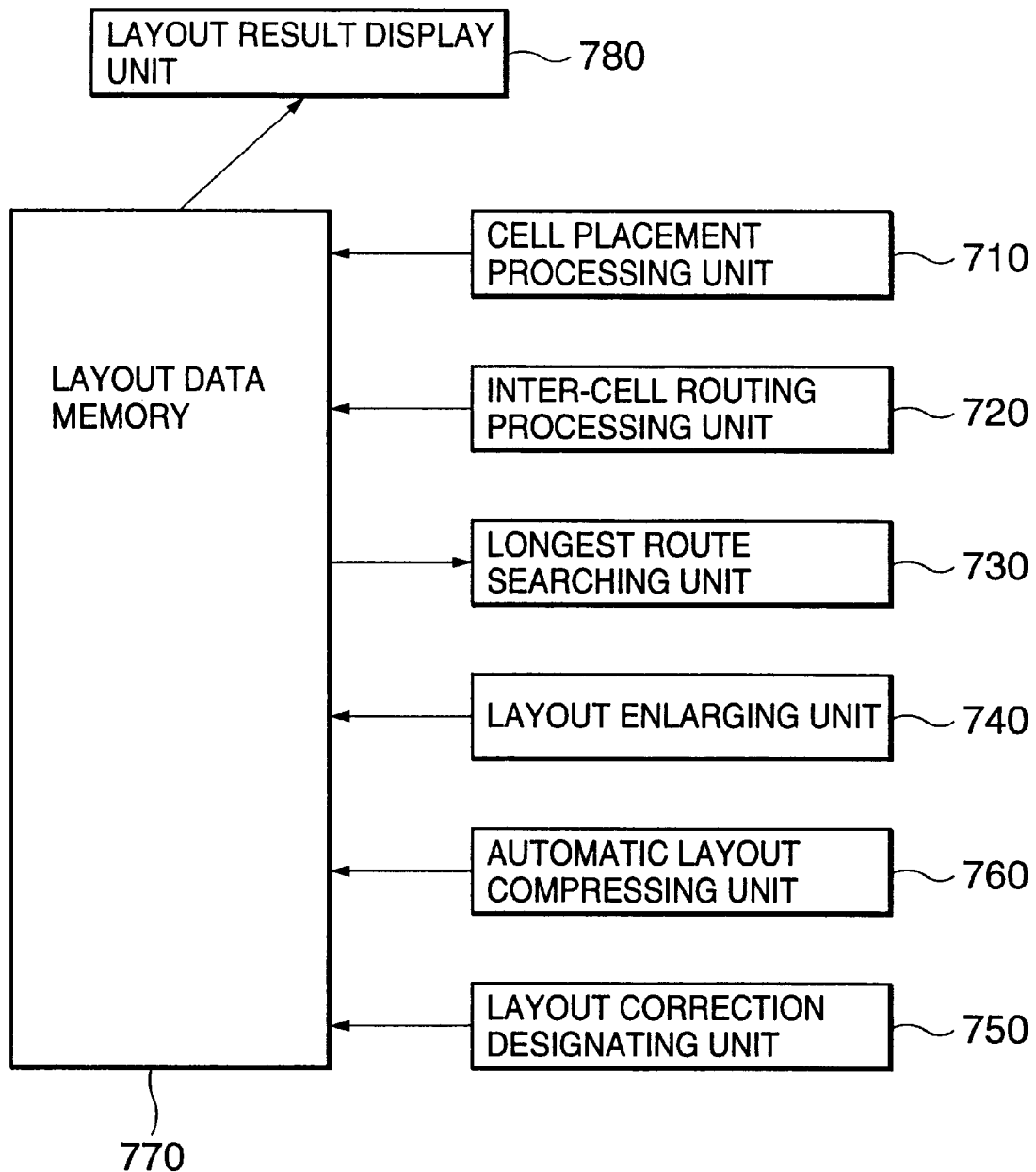
FIG. 1 is a block diagram of a conventional layout compaction system.
Figures 2A, 2B:
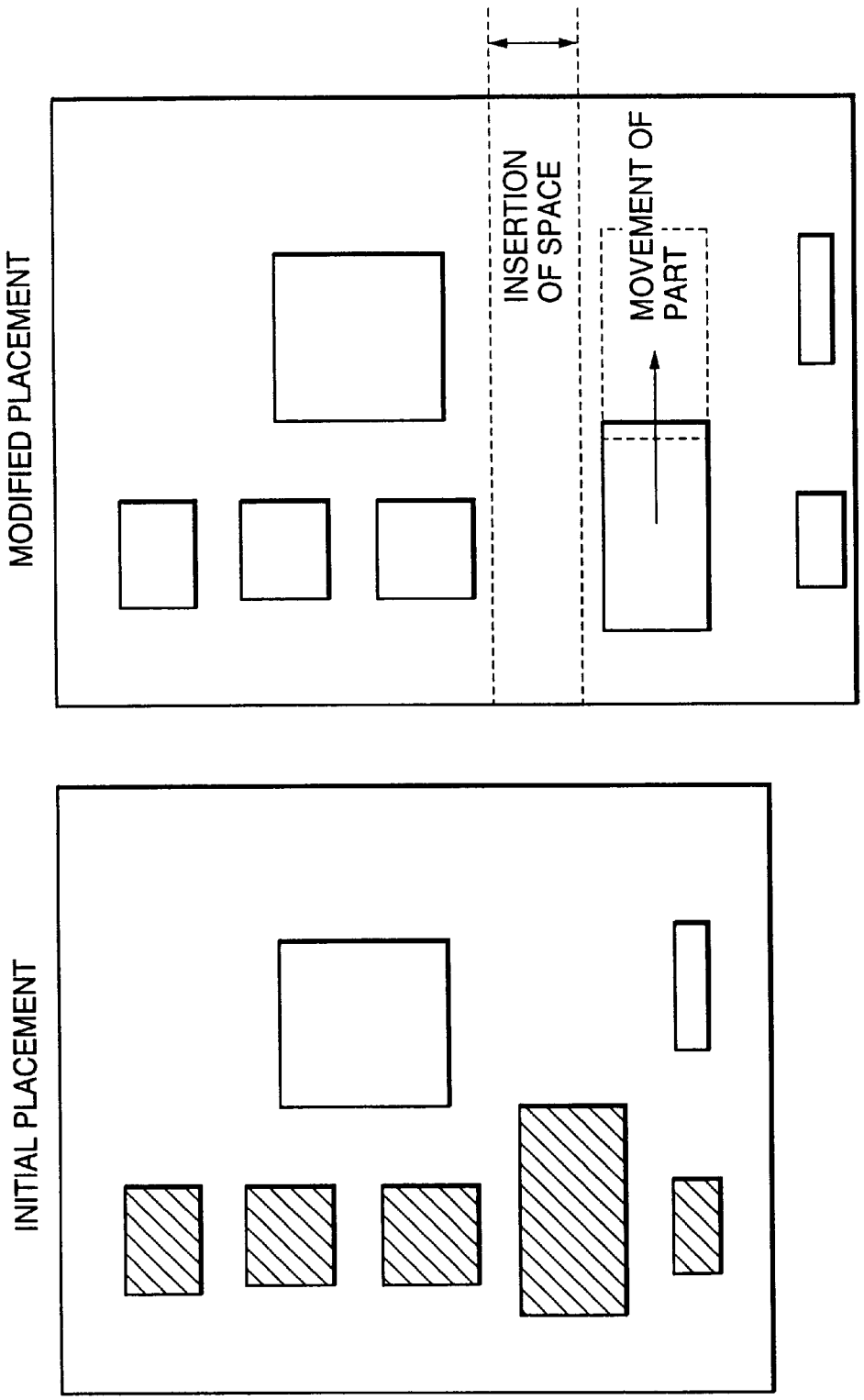
FIGS. 2A and 2B are views for describing an operation of the conventional layout compaction system in FIG. 1.

Now, several preferred embodiments of this invention will be described in detail with reference to the drawing.

Figure 3:
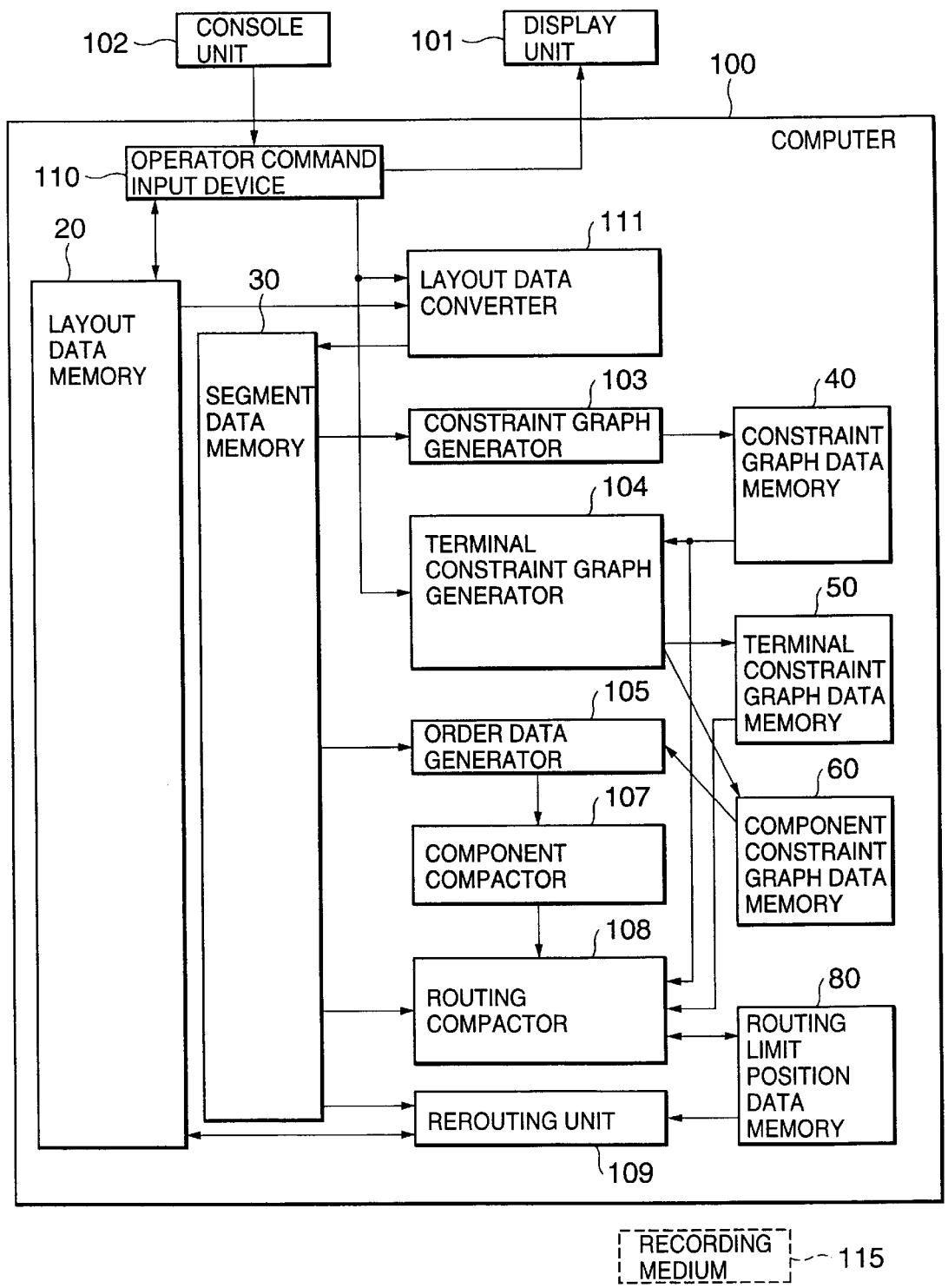
FIG. 3 is a block diagram of a graphic layout compaction system according to a first embodiment of this invention.

Referring to FIG. 3, a graphic layout compaction system according to a first embodiment of this invention comprises a computer 100 operated under control of a program, a display unit 101, and a console unit 102. The computer 100 may comprise a central processing unit, a processor, or a data processor. The display unit 101 may comprise a CRT display or a liquid crystal display. The console unit 102 may comprise a keyboard and a mouse or a tablet.

The computer 100 comprises a layout data converter 111, an operator command input device 110, a constraint graph generator 103, a terminal constraint graph generator 104, an order data generator 105, a component compactor 107, a routing compactor 108, a rerouting unit 109, a layout data memory 20, a segment data memory 30, a constraint graph data memory 40, a terminal constraint graph data memory 50, and a component constraint graph data memory 60.

Supplied with layout data of a printed-circuit board from the layout data memory 20, the layout data converter 111 produces segment data to be memorized in the segment data memory 30. Specifically, each configuration in the layout data is decomposed into a plurality of segments represented by the segment data. Each segment is assigned with a segment number 31.

From the segment data memory 30, the constraint graph generator 103 extracts those segment data which correspond to component terminals, via holes, or routes (wires) adjacent in a direction Y or X. The constraint graph generator 103 prepares constraint graph data representing a Y-direction or an X-direction constraint graph connecting adjacent ones of the segment numbers adjacent in the direction Y or X. The constraint graph data are memorized in the constraint graph data memory 40. in the present specification, the via holes and board ends are also referred to as components.

The terminal constraint graph generator 104 prepares terminal constraint graph data representing a pair of component terminals or component contours (configurations) as opposite nodes and a terminal relative movement limit length 62. The terminal relative movement limit length 62 represents a limit of movement within which one of the nodes is allowed to move towards the other node. The terminal constraint graph data are assigned with a terminal constraint graph number 51 and memorized in the terminal constraint graph data memory 40. In addition, the terminal constraint graph generator 104 prepares component constraint graph data representing a pair of component numbers 32 as opposite nodes, the component relative movement limit length 62, and the terminal constraint graph number 51. The component constraint graph data are memorized in the component constraint graph data memory 60.

The order data generator 105 selects, among the component constraint graph data memorized in the component constraint graph data memory 60, those component constraint graph data giving a shortest route length.

The component compactor 107 moves the components in the direction X or Y (quantizing direction) by the shortest route length.

The routing compactor 10 prepares routing limit position data representative of a routing (wiring) limit position For a particular route interposed between the component terminals as the opposite nodes of the terminal constraint graph data, the routing lint position is defined along the contour of one of the component terminals in the form of an octagonal configuration. The routing limit position data are memorized in the routing limit position data memory 80.

The rerouting unit 109 shapes the route (wire) into a configuration including diagonal parts and rearranges the route (wire). A resultant layout is memorized in the layout data memory 20.

Next referring to FIGS. 4 and 5 together with FIGS. 9 through 13, the operation of the graphic layout compaction system will be described.

Figure 4:
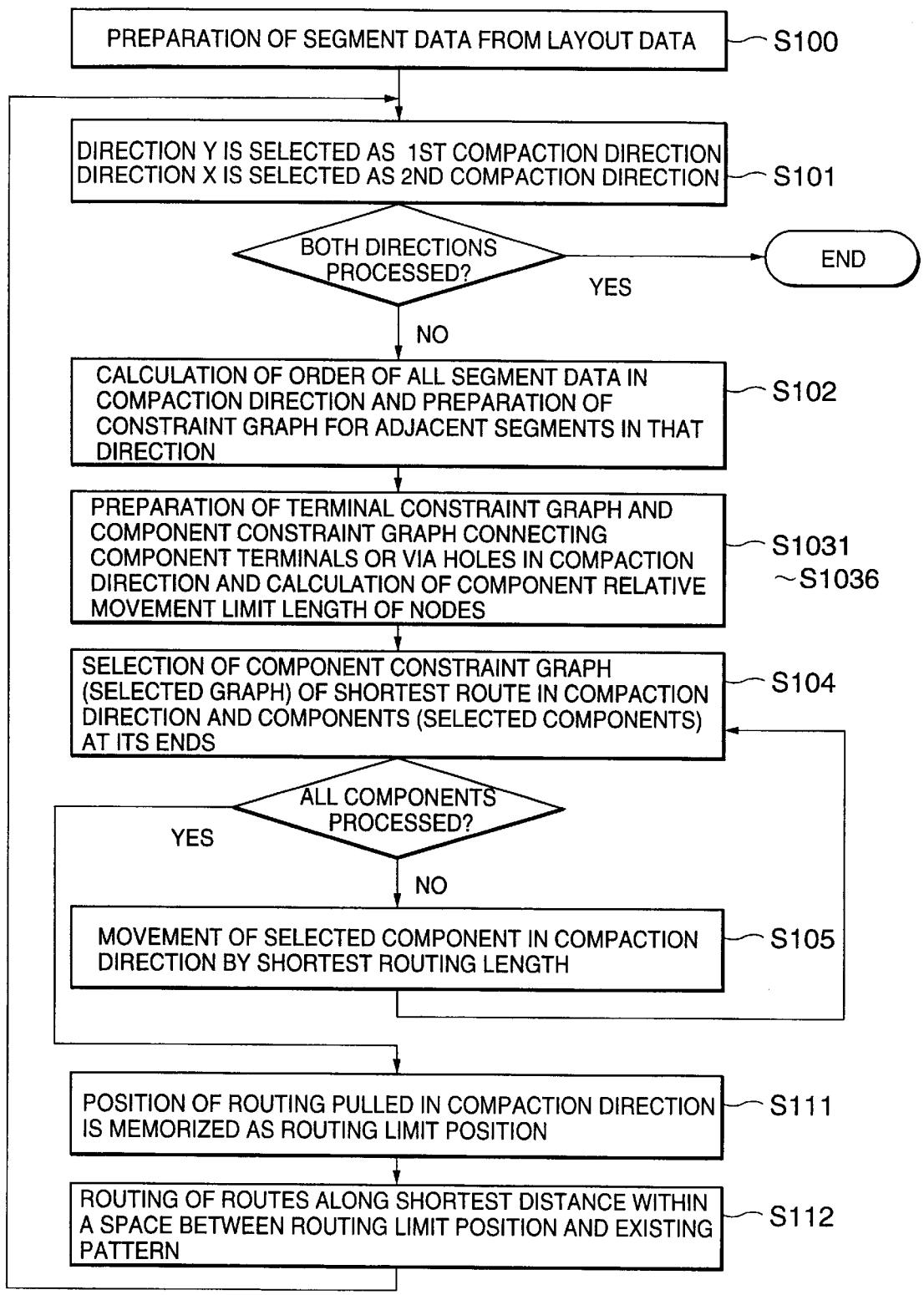
FIG. 4 is a flow chart for describing an operation of the graphic layout compaction system in FIG. 3.
Figure 9:
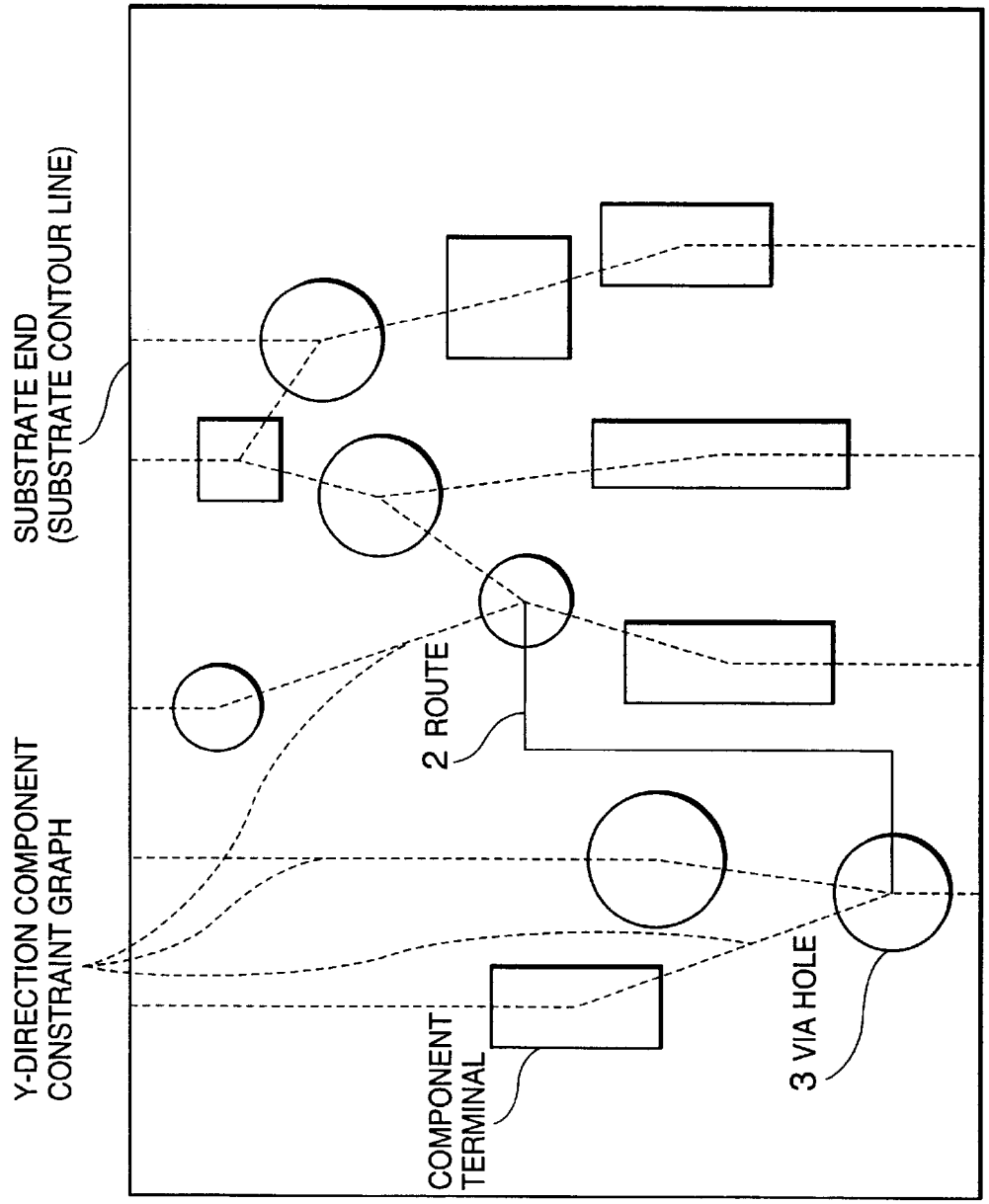
FIG. 9 is a view showing an initial state of the layout.
Figure 10:
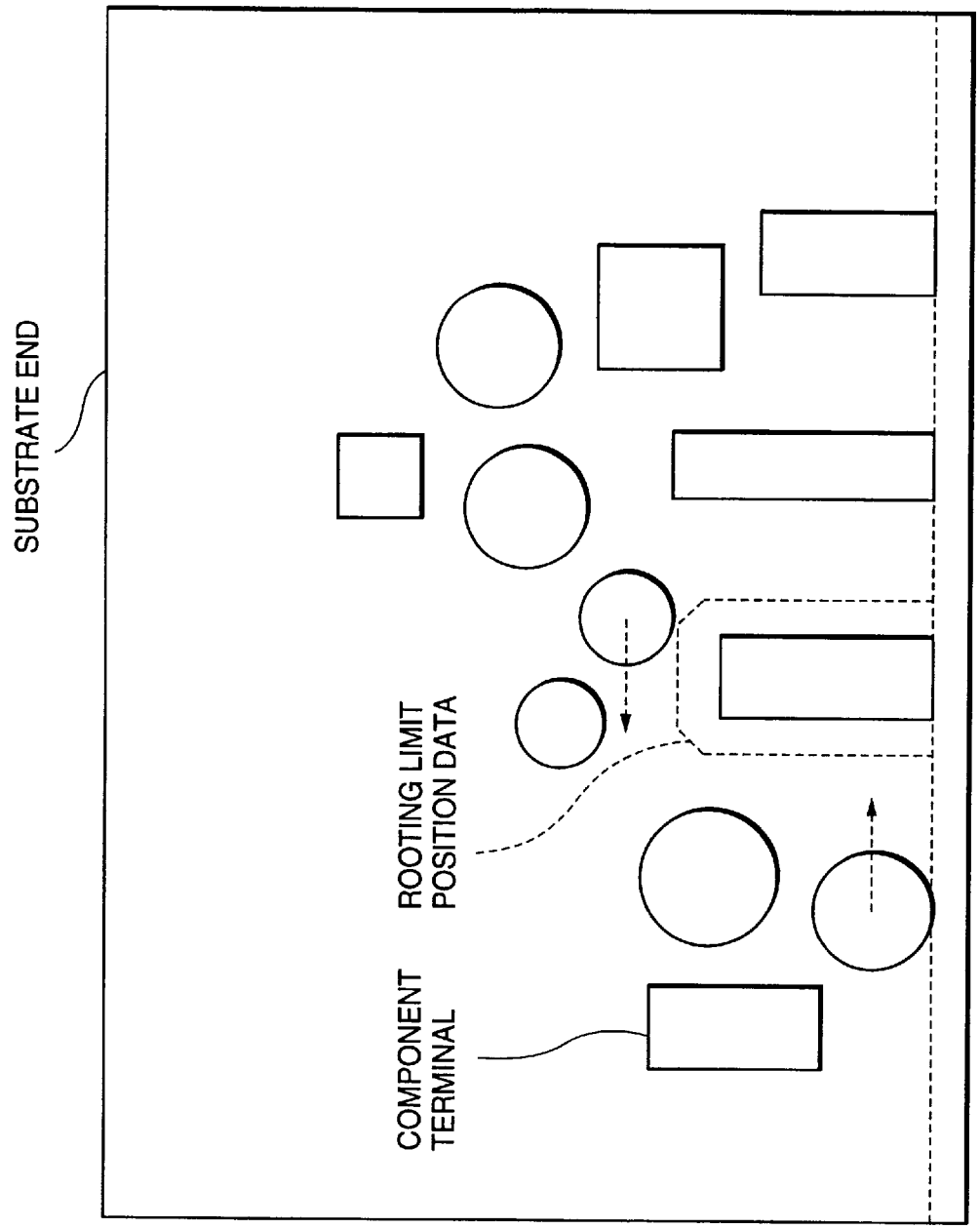
FIG. 10 is a view showing the layout in FIG. 9 after compaction in one direction.

Referring to FIG. 4, the layout data converter 111 is supplied with the layout data illustrated in FIG. 9 and prepares the segment data. Specifically, various graphic elements in a layout pattern, such as the component terminals, the via holes, the wires, polygonal conductor configurations, component contours, substrate contour lines, and marking patterns and characters are decomposed per each layer plane into the segments each of which is approximated to an octagonal configuration. The segment data representative of each segment have data structures illustrated in FIGS. 6A and 6B (step S100).

More specifically, the layout data converter 111 arranges the component terminals and the wires on a signal layer plane and a power supply and ground layer plane while the component contours are arranged on a component contour layer plane The layout data converter 111 arranges on a marking layer plane the marking patterns and characters together with a marking inhibiting region such as working hole positions interfering the marking patterns and characters. In addition, the layout data converter 111 decomposes the routes for each of the signal layer plane and the power supply and ground layer plane into route segments divided at bending points, branching points, and intersecting points with the component terminals. The polygonal conductor configurations are decomposed into a plurality of sides. Thus, the segment data are prepared for the routes and the polygonal conductor configurations.

The layout data converter 111 assigns the segment data of the components decomposed per layer plane with the individual component numbers 32. Likewise, the via holes are assigned with the individual component numbers 32. The sides of the substrate contour lines are assigned with a common component number 32. These component numbers 32 are recorded in the segment data. In the present specification, the substrate contour lines and the via holes are also called the components.

Referring to FIGS. 6A and 6B, the data structures of the segment data prepared by the layout data converter 111 will be described.

As illustrated in FIG. 6A, the segment data of the component terminal or the via hole include the component number 32. The component number 32 is common to all segment data of the terminals associated with a single component. The component number 32 is common to all segment data of a single via hole 3 in all layer planes. In addition, the segment data of the component terminal or the via hole include a configuration number 36 of configuration data 35 (FIG. 6D) representing the configuration of the segment.

As illustrated in FIG. 6B, the segment data of the route (wire) 2 connected to the component terminal 1 or the via hole 3 include a pair of position numbers 33 for first and second ends of the route 2. Each of the position numbers 33 of the route 2 is common to that of the terminal 1, the via hole 3, or the end of another route 2 connected to each corresponding end of the route 2. In addition, the segment data of the route 2 include the configuration number 36 representative of the width of the route (wire).

As illustrated in FIG. 6C, position data 34 include the position number 33, X and Y coordinate values, a layer plans number, and the component number 32 associated with the position number 33.

Referring to FIG. 6D, the configuration of each graphic element is described and memorized as the configuration data 35. The configuration data 35 include the configuration number 36, and the widths of the graphic element in the longitudinal, the lateral, first diagonal (rotated by 45° counterclockwise from the lateral direction), and second diagonal (rotated by 45° clockwise from the lateral direction) to represent the graphic pattern as an octagonal configuration. The segment data of the polygonal conductor configuration 4 are prepared for a line segment as each side thereof and have the data structure illustrated in FIG. 6B, including the indication of a fixed configuration.

In the initial layout of the printed-circuit board, a gap between adjacent ones of the wires 2, the terminals 1, the via holes 3, and the polygonal conductor configurations 4 may be smaller than a minimum allowable gap defined in the design rule. According to the first embodiment, such smaller gap is modified as will later be described.

Then, in a step S101, the direction Y is selected as a first compaction direction. The step S101 is followed by steps S102 through S112 Then, the operation returns to the step S101 to select the direction X as a second compaction direction. Again, the steps S102 through S112 are carried out. When compaction is completed in both of the first and the second compaction directions, the operation will come to an end.

In the step S102 following the step S101, the constraint graph generator 103 reads per layer plane the segment data from the segment data memory 30 in the order of the X coordinate values in the layer plane. The order of arrangement of the segment numbers 31 in the direction Y is determined with reference to the Y coordinate values to obtain each pair of adjacent ones of the sat numbers 31 adjacent in the direction Y as the first compaction direction. As illustrated in FIG. 7A, preparation is made of Y-direction constraint graph data which represent the above-mentioned pair of segment numbers 31 as first and second nodes in the order of the Y coordinate values. In preparing the constraint graph data, the segment numbers 31 having a common signal name 37 are assumed to be transparent to each other. These segment numbers 31 having the common signal name 37 are connected in parallel from another segment number 31 having a different signal name 37. The constraint graph generator 103 calculates the order of the constraint graph data in the order of the segment numbers 31 included therein from the lowermost one in the direction Y. The order of the constraint graph data is recorded as Y-direction constraint graph order data (not shown).

Figure 5:
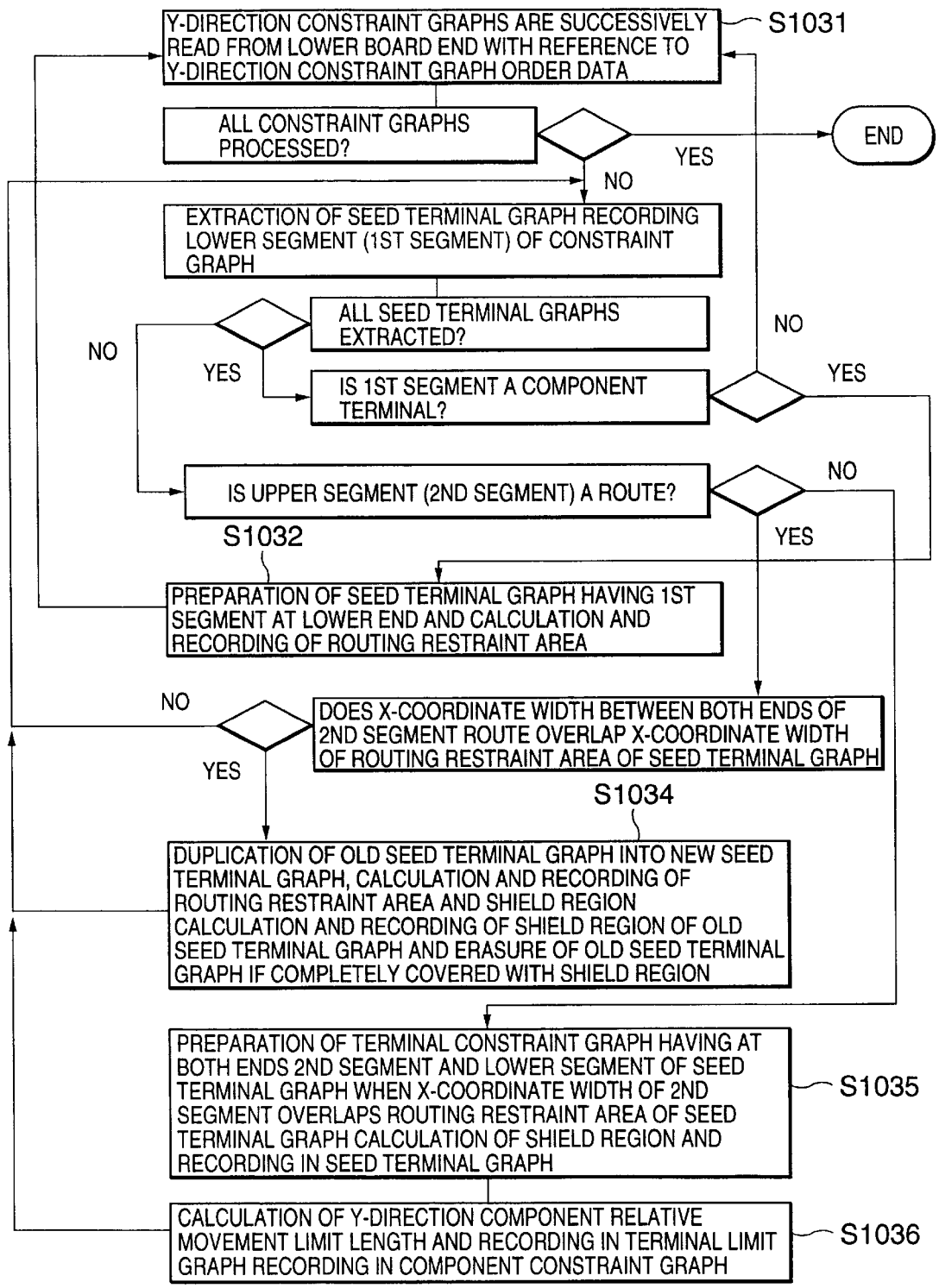
FIG. 5 is a flow chart for describing in detail a part of the operation in FIG. 4.

In steps S1031 through S1036 illustrated in FIG. 5, the terminal constraint graph generator 104 calculates a route connecting the segment data for which the adjacency is memorized in the Y-direction constraint graph data. Thus, the route having the component terminals at both ends is obtained and the Y-direction terminal constraint graph data having a data structure illustrated in FIG. 7B are prepared.

At first in the step S1031, the terminal constraint graph generator 104 reads all of the Y-direction constraint graph data from the constraint graph data memory 40 in the order from a lower substrate end to an upper substrate end with reference to the Y-direction constraint graph order data to obtain the segment numbers 31 of their nodes. The lower and the upper segments will be called first and second segments, respectively.

Next, the terminal constraint graph generator 104 extracts seed terminal graph data 53 (prepared in the step S1032 which will later be described) to record the first segment. The seed terminal graph data 53 are illustrated in FIG. 7C. In absence of the seed terminal graph data 53 corresponding to the first segment and if the first segment is a component terminal, the operation proceeds to the step S1032. On the other hand, in presence of the seed terminal graph data 53 recording the first segment, the operation proceeds to the step S1034 and the step S1035 when the second segment is the route and the component terminal, respectively. After processing all of the constraint graph data in the Y-direction constraint graph order data, the operation proceeds to the step S104.

In the step S1032, the terminal constraint graph generator 104 prepares, when the first segment is the component terminal, the seed terminal graph data 53 with the segment number 31 (lower segment) of the component terminal as a lower end. In the seed terminal graph data 53, the route segment number 31 on the constraint graph data is recorded as an interposed route segment number 31. With respect to the seed terminal graph data 53, the terminal constraint graph generator 104 calculates a routing zone width 52 which is a bus of the width of the route and the widths of necessary gaps above and below the route. The routing zone width 52 is recorded in the seed terminal graph data 53. Calculation is made of a routing restraint area width which is a sum of the width of the lower component terminal in the lateral direction (direction X) and the routing zone width 52. The routing restraint area width is memorized in the seed terminal graph data 52. Then, the operation returns to the step S1031.

In the step S1034, the terminal constraint graph generator 104 extracts the seed terminal graph data 53 recording the first segment when the second segment is the route. The following operation is carried out for every seed terminal graph data 53.

Specifically, the terminal constraint graph generator 104 duplicates the seed terminal graph data 53 into new seed terminal graph data 53 when the X-coordinate width between the both ends of the route as the second segment overlaps the X-coordinate width of the routing restraint area in the seed terminal graph data 53. The new data are recorded with the segment number 31 of the second segment added thereto. The terminal constraint graph generator 104 calculates a new routing restraint area width which is a sum of the routing restraint area width in the old data, the width of the additional route, and the necessary gap. The new routing restraint area width thus calculated is recorded in the seed terminal graph data 53. Likewise, a new shield region width is calculated as a sum of an old shield region width, the width of the routing as the upper segment, and the necessary gap. The new shield region width thus calculated is recorded in the seed terminal graph data 53. The terminal constraint graph generator 104 records the X-coordinate width of the second segment as the shield region width in the seed terminal graph data 53 as the old data. When the routing restraint area of the seed terminal graph data 53 is completely covered with the shield region, the terminal constraint graph generator 104 erases the seed terminal graph data 53.

In the step S1035, the terminal constraint graph generator 104 extracts, when the second segment is a component terminal, the seed terminal graph data 53 recording the first segment and carries out the following operation for every seed terminal graph data 53. When all of the seed terminal graph data 53 are processed, the operation returns to the step S1031.

Specifically, when the X coordinate width of the second segment overlaps the X coordinate width of the routing restraint area in the seed terminal graph data 53 (when Equation (1) later described is satisfied), the terminal constraint graph generator 104 prepares the terminal constraint graph data illustrated in FIG. 7B. Specifically, the terminal constraint graph data include, as nodes, the component terminal segment number 31 of the second segment as an upper-end component terminal and the component terminal segment number 31 at the lower end of the seed terminal graph data 53. The terminal constraint graph data further include the routing zone width 52 of the seed terminal graph data 53 as the routing zone width 52 between the nodes. Furthermore, in the seed terminal graph data 53, the terminal constraint graph generator 104 records, as the shield region width, the X-coordinate width of the segment data associated with the component terminal of the upper segment.

When the routing restraint area of the seed terminal graph data 53 is completely covered with the shield region, the terminal constraint graph generator 104 erases the seed terminal graph data 53. Then, the operation proceeds to the next step S1036. In the above-mentioned step S1035, the terminal constraint graph generator 104 can prepare, even if the upper and the lower segments are spaced at a predetermined distance in the direction X, the terminal constraint graph data with those segments as the both ends. This is achieved by enlarging the X-coordinate width of the segment data of the upper segment by the predetermined distance. In addition, the terminal constraint graph generator 104 can perform the step S103 and the subsequent steps in the following condition. Specifically, the routing restraint area by the lower segment is shaped as a rectangle and the sum of the width of the lower segment in each of the directions X and Y and the routing zone width 52 is used as the width of the routing restraint area in each of the directions X and Y.

Figure 8:
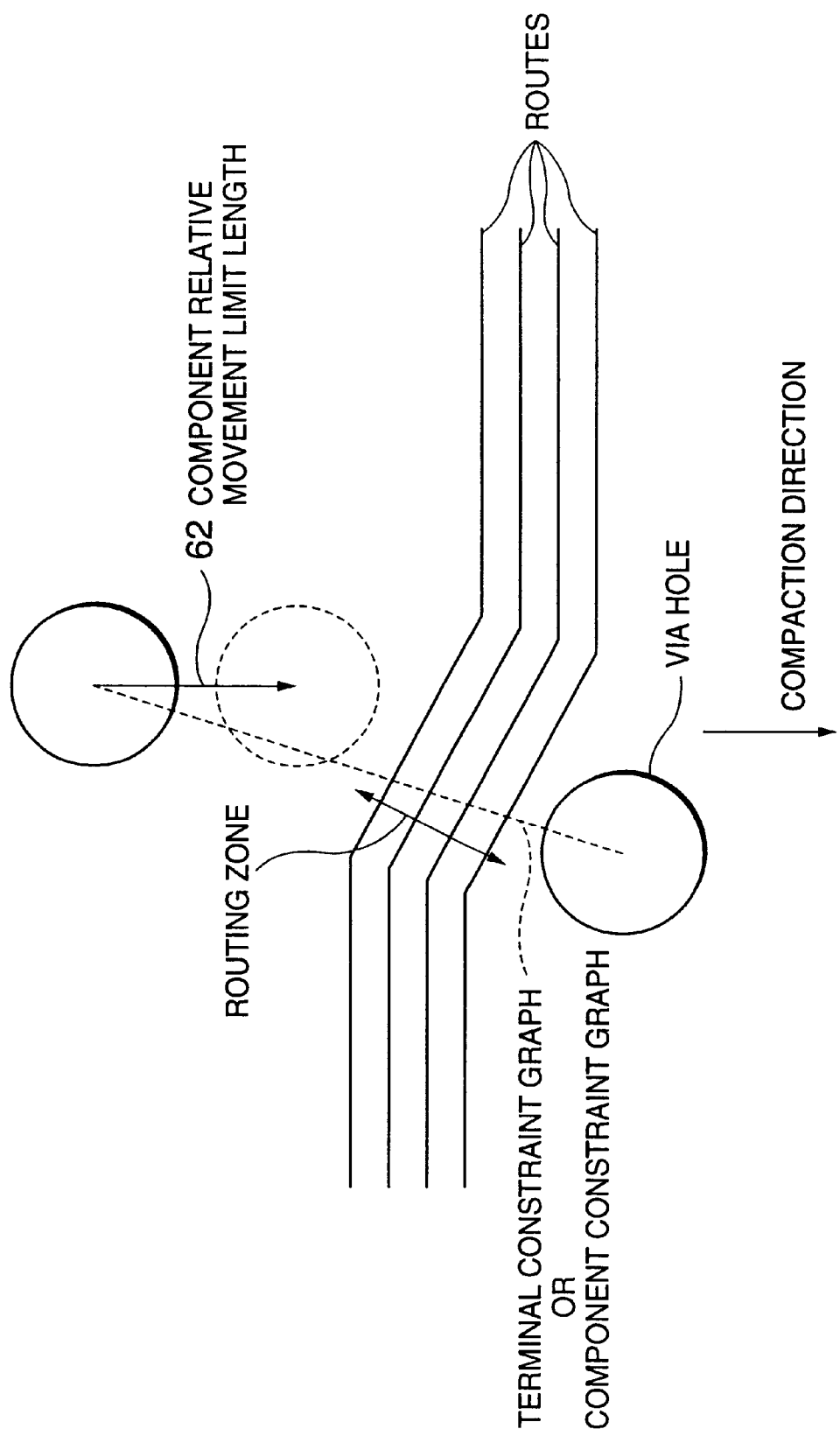
FIG. 8 is a view showing a layout used in the graphic layout compaction system in FIG. 3.

In the step S1036, the terminal constraint graph generator 104 calculates the Y-direction component relative movement limit length 62 shown in FIG. 8, in the manner which will presently be described. The component relative movement limit length 62 (M) is a loft within which the component is movable in a moving direction with the routing zone freely diagonally bendable between the upper and the lower segments. Specifically, a coordinate axis in the direction Y is labelled a Q axis while the direction X perpendicular thereto is labelled a V axis, as illustrated in FIG. B. Then, a relative coordinate of each of the upper and the lower component terminals is represented by (V, Q). The sum of the radii of the both terminals in the direction V [=Y] and the wiring zone width 52 is represented by Bv. Likewise, the sum of the radii of the both terminals in the direction Q [=X] and the routing zone width 52 is represented by Bq. The sum of the radii and the routing zone width 52 as a measure from the center of the one terminal to the other terminal is represented by Bz, when the both terminals are projected onto the coordinate V+Q. The sum of the radii and the routing zone width 52 as a measure from the center of the one terminal to the other terminal is represented by Bw, when the both terminals are projected on the coordinate Q–V. The minimum value of M is calculated by the following equations and used as the component relative movement limit length 62.

$$-Bv < V > Bv \quad (1)$$

$$U \leq Bq \quad (2)$$

$$U \leq Bz - V \quad (3)$$

$$U \leq Bw + V \quad (4)$$

$$M = Q - U \quad (5)$$

The terminal constraint graph generator 104 prepares the terminal constraint graph data having a graph length equal to the component relative movement limit length 62 in the direction Y. The terminal constraint graph data are memorized in the terminal constraint graph data memory 50.

The terminal constraint graph generator 104 prepares the component constraint graph data depicted by dotted lines in FIG. 9. As illustrated in FIG. 7D, the component constraint graph data include as nodes the component numbers 32 of the terminals at opposite ends of the X-direction terminal constraint graph data, the Y-direction component relative movement limit length 62, and the terminal constraint graph number 51. The component constraint graph data are memorized in the component constraint graph data memory 60. Herein, when existing component constraint graph data are memorized in the component constraint graph data memory 60, the terminal constraint graph generator 104 renews the Y-direction component relative movement lent length 62 into a smaller value. Next, the step S1035 is repeated for another seed terminal graph data 53.

In the subsequent step S104, the order data generator 105 calculates a shortest route in the direction Y. Using a compaction technique based on the Dijkstra method, the order data generator 105 extracts the Y-direction component, constraint graph data (a) having as a core the shortest route of the Y-direction component constraint graph data from the board end and (b) connected to the component terminal as the node of the shortest route. The order data generator 105 calculates, as a Y-direction route length of the component number 32 at the other end, the sum of the shortest route length of the component connected thereto and the component relative movement limit length 62 of the component constraint graph data. The order data generator 105 selects as a selected graph one of the component constraint graph data which has a shortest route length. The route length of the selected graph is used as the shortest route length of the component number 32 at that end The component constraint graph data are added to the shortest route. In the present specification, the component number 32 at that node (branch-side node) will be called a selected component.

In the step S105, the component compactor 107 extracts as selected terminals respective terminals of the selected component. The selected terminals are successively moved in the direction Y by the shortest route length and located at appropriate positions. When all of the selected terminals of the selected component are processed, the operation returns to the step S104.

By repeating the steps S104 and S105, the component constraint graph data 60 are successively registered in the shortest route and the layout of the components is compacted. If the gap between adjacent ones of the routes 2, the terminals 1, the via holes 3, and the polygonal conductor configurations 4 in the initial layout of the printed wiring board is smaller than the minimum allowable gap in the design rule, such smaller gap is modified in the above-mentioned process.

In the step S111, the routing compactor 103 reads the route segment numbers 31 in the order memorized in the Y-direction constraint graph order data and extracts from the terminal constraint graph data memory 50 the terminal constraint graph data including each routing segment number 31. The routing compactor 108 calculates the routing zone width 52 which is a half of the sum of the width of another route present between the component terminals at both ends of the terminal constraint graph data thus extracted, a necessary gap, and the width of the processed wire segment. The routing zone width 52 is reserved along the contour of each component terminal in eight directions (opposite directions in each of longitudinal, lateral, and first and second diagonal directions) to prepare the configuration data 35 of the routing restraint area having an octagonal configuration around the component terminal.

If any route already fixed in position is present therebetween, the routing compactor 103 prepares the configuration data 35 of the routing restraint area having an octagonal configuration around the fixed route as a fixed configuration. The routing restraint area is prepared assuming unfixed and deformable routes are freely bent to surround the fixed route. The routing compactor 108 records the configuration number 36, the processed wire segment number 31, the component terminal segment number 31, and the component terminal position number 33 in the routing limit position data having a data structure shown in FIG. 6E.

In the step S112, the rerouting unit 109 shapes the processed route into a trimmed configuration including diagonal parts and rearranges the processed route outside of the routing restraint area in the routing limit position data.

Then, the operation returns to the step S101 to repeat the similar process in the direction X to perform compaction in the direction X.

As described above, compaction in the direction Y is performed through the steps S101 through S112 and compaction in the direction X is performed by repeating the similar process.

Next referring to FIGS. 9 through 13, the operation of the graphic layout compaction system according to the first embodiment will be described in conjunction with a specific example.

Figure 11:
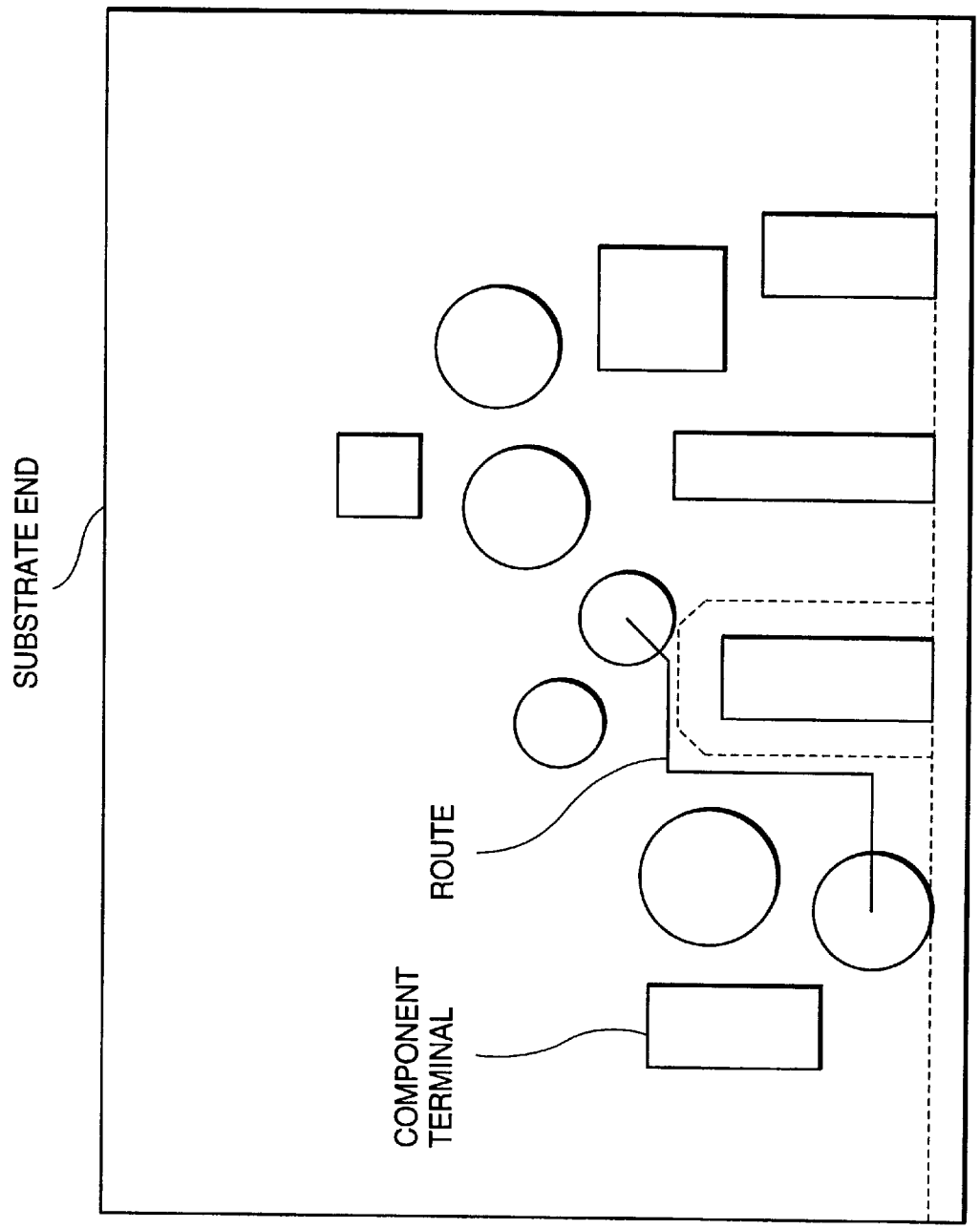
FIG. 11 is a view showing the layout in FIG. 10 after rearrangement of wires.

Referring to FIG. 9, the printed-circuit board has an initial arrangement illustrated in the figure. At first, the compaction direction is set at the direction Y. The component compactor 107 compacts the components downward to obtain a modified arrangement in FIG. 10. Then, the routing compactor 108 calculates the routing limit position data, as depicted by a dotted line in FIG. 10. The rerouting unit 109 reroutes or rearranges the routes into a trimmed configuration including diagonal parts, as illustrated in FIG. 11.

Figure 12:
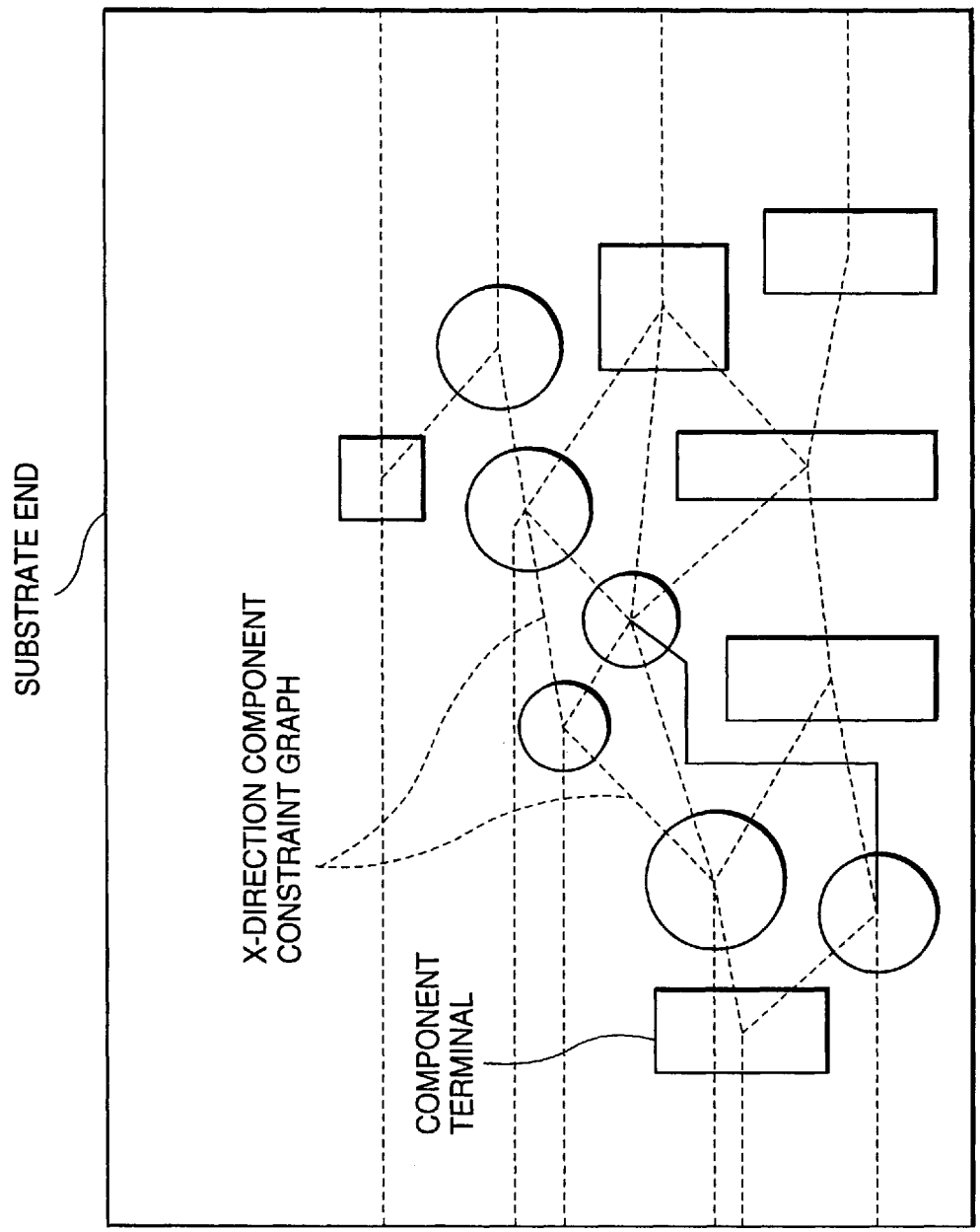
FIG. 12 is a view showing the layout in FIG. 11 together with a component constraint graph.
Figure 13:
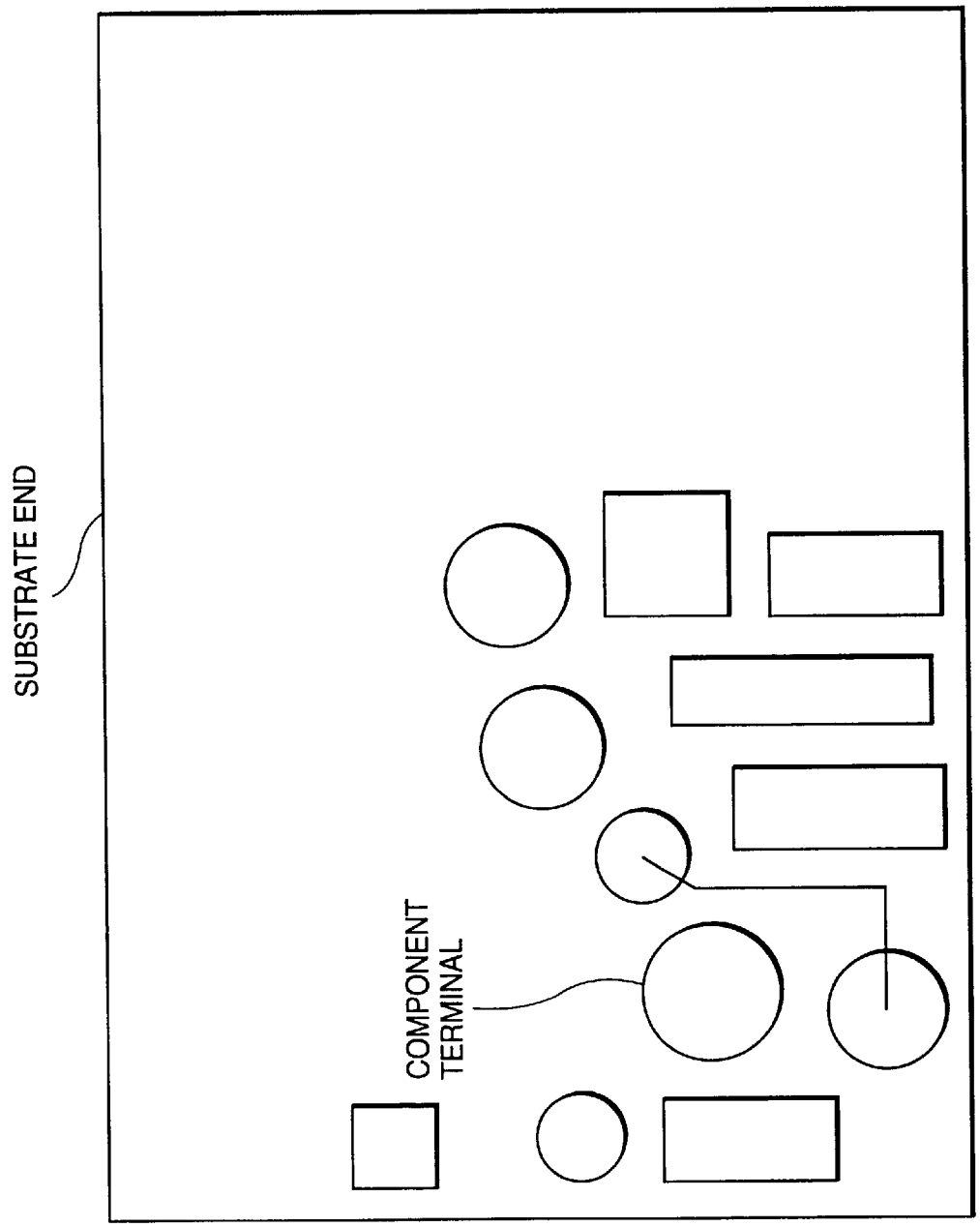
FIG. 13 is a view showing the layout in FIG. 12 after compaction in the other direction and rearrangement of the wires.

Next, the compaction direction is set at the direction X. The terminal constraint graph generator 104 prepares the component constraint graph data, as illustrated in FIG. 12. The component compactor 107 compacts the components leftward to obtain a modified arrangement illustrated in FIG. 13. The routing compactor 108 and the rerouting unit 109 rearrange the route in a trimmed configuration including diagonal parts, as illustrated in FIG. 13.

The above-mentioned graphic layout compaction system has the following effects.

As a first effect, it is possible to arrange the route in a flexible configuration without being biased in the compaction direction and with a gap kept from each of the component terminals and the routes therearound. This is because the compaction of the components is at first performed with a sufficient routing region reserved and thereafter the routing limit position data are calculated. Within the limited range, the route is arranged in a flexible configuration.

As a second effect, those routes having a common signal name 37 can be freely arranged without any constraint from their mutual relationship in the initial arrangement and without any influence of one's position upon the other. This is because the constraint graph data are prepared assuming those routes having the common signal name 37 to be transparent to each other.

Figure 14:
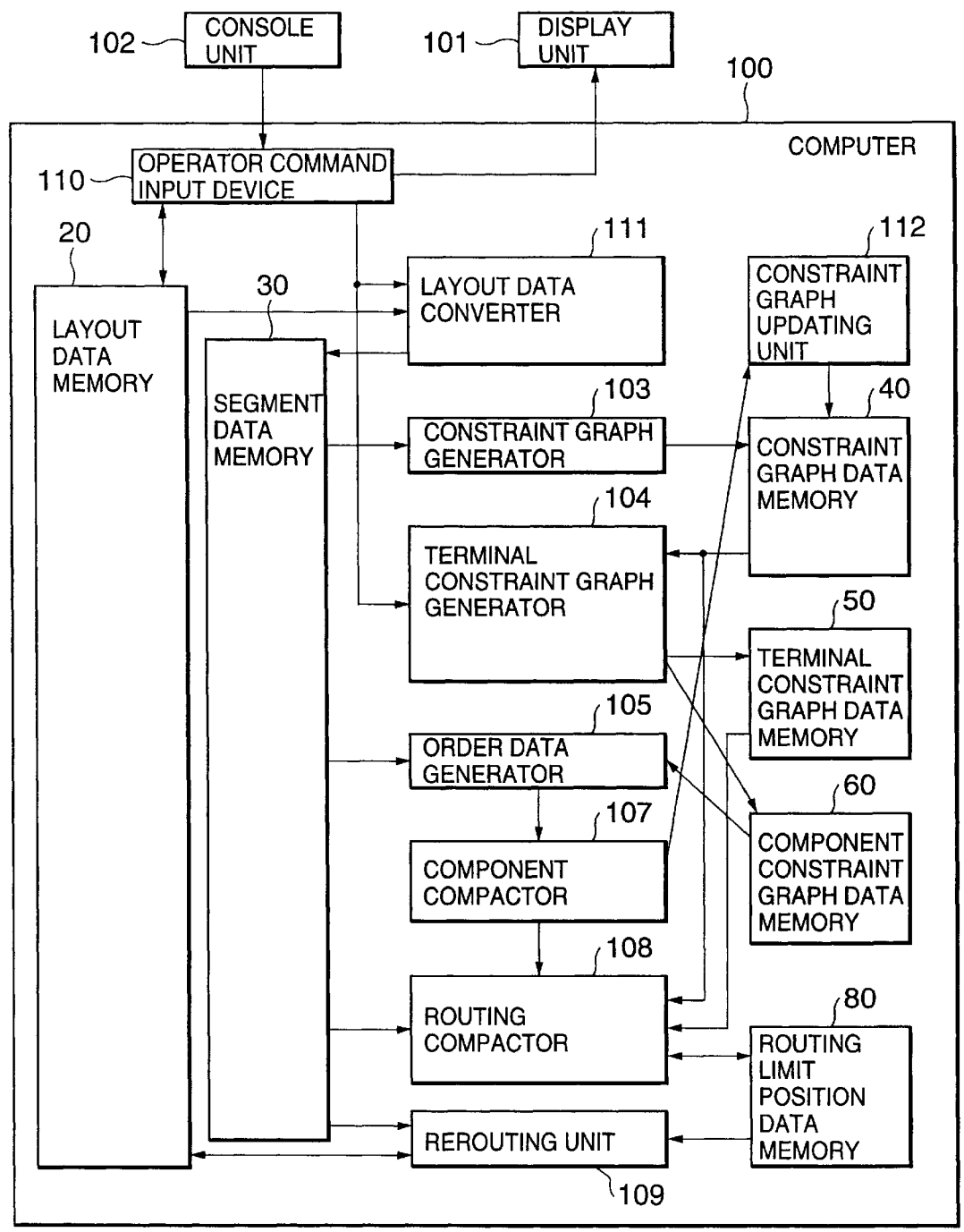
FIG. 14 is a block diagram of a graphic layout compaction system according to a second embodiment of this invention.

Referring to FIG. 14, a graphic layout compaction system according to a second embodiment of this invention comprises a computer 100 operated under control of a program, a display unit 101, and a console section 102, like the first embodiment. The computer 100 may comprise a central processing unit, a processor, or a data processor. The display unit 101 may comprise a CRT display or a liquid crystal display. The console unit 102 may comprise a keyboard and a mouse or a tablet.

The graphic layout compaction system according to the second embodiment is similar in structure to the first embodiment except that the computer 100 further comprises a constraint graph updating unit 112.

The constraint graph updating unit 112 is for calculating modification of the constraint graph data resulting from the movement of the components and the routes connected thereto to update the constraint graph data.

Figure 15:
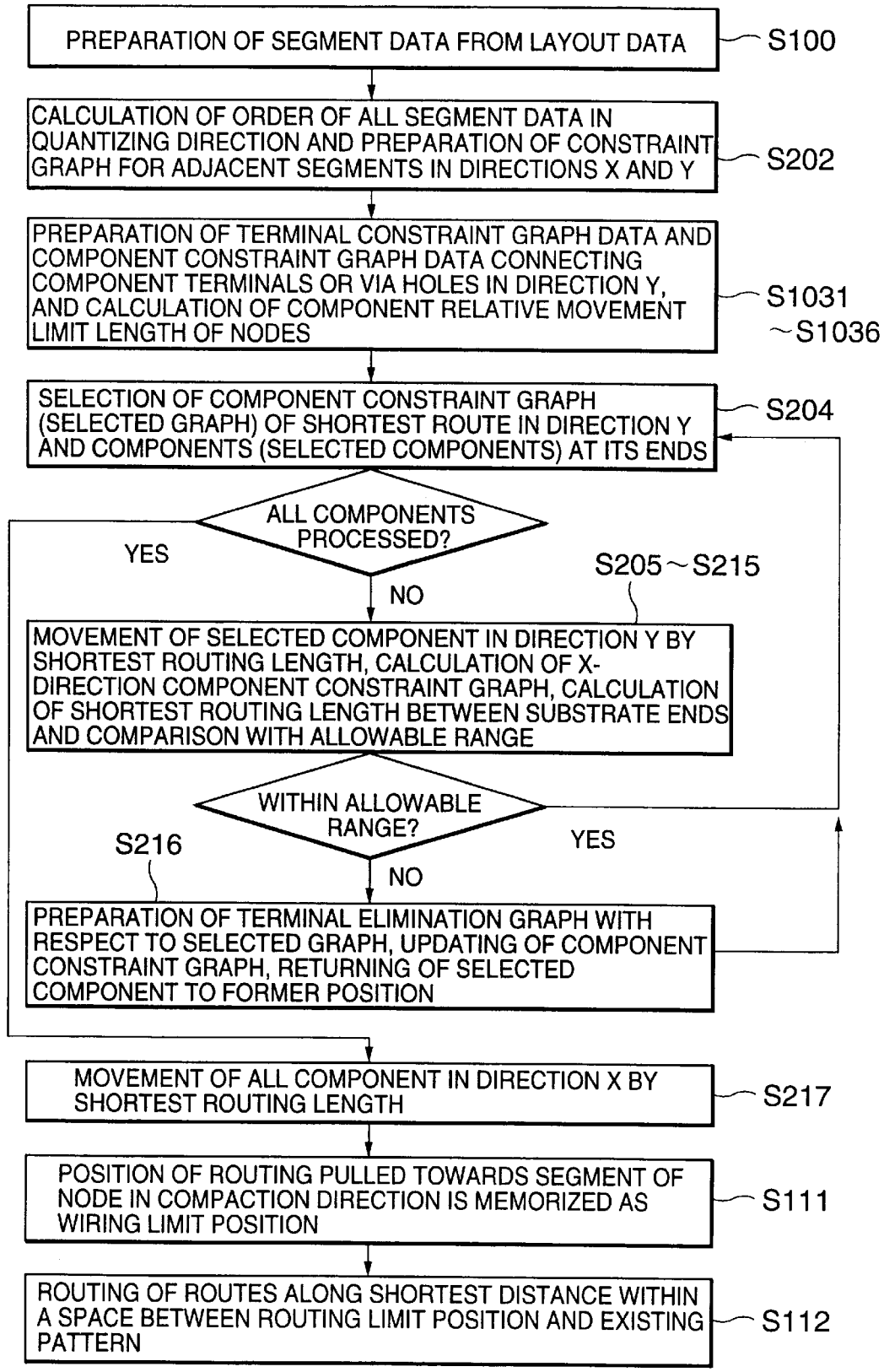
FIG. 15 is a flow chart for describing an operation of the graphic layout compaction system illustrated in FIG. 14.

Next referring to FIGS. 15 through 17, the operation of the graphic layout compaction system according to the second embodiment will be described in detail.

At first, the layout data converter 111 is supplied with the layout data and prepares the segment data in the manner similar to the first embodiment (step S100).

In a step S202 following the step S100, the constraint graph generator 103 reads per layer plane the segment data from the segment data memory 30 in the order of the X coordinate values in the layer plane. The order of arrangement of the segment data in the direction Y is determined with reference to the Y coordinate values to obtain each pair of adjacent ones of the segment numbers 31 adjacent in the direction Y as the first compaction direction. As illustrated in FIG. 7A, preparation is made of Y-direction constraint graph data which represent the above-mentioned pair of segment numbers 31 as first and second nodes in the order of the Y coordinate values. The constraint graph generator 103 calculates the order of the constraint graph data in the order of the segment numbers 31 included therein from the lowest one in the direction Y. The order of constraint graph numbers 41 of the constraint graph data is recorded as the Y-direction constraint graph order data. In the second embodiment, the constraint graph generator 103 also prepares constraint graph data for the direction X and X-direction constraint graph order data.

Next, in the manner similar to the first embodiment, the terminal constraint graph generator 104 calculates a route connecting the segment data for which the adjacency is memorized in the Y-direction constraint graph data (steps S1031–S1036 in FIG. 5). Thus, the route having the component terminals at both ends is obtained and the Y-direction terminal constraint graph data having the data structure shown in FIG. 7B are prepared.

In a subsequent step S204, the order data generator 105 calculates a shortest route in the direction Y. Using a compaction technique based on the Dijkstra method, the order data generator 105 extracts from a terminal constraint graph data memory 40 the Y-direction component constraint graph data (a) having as a core the shortest route of the Y-direction component constraint graph data from the substrate end and (b) connected to the component terminal as the node of the shortest route. The order data generator 105 calculates, as a Y-direction route length of the component number 32 at the other end, the sum of the shortest route length of the component connected thereto and the component relative movement limit length 62 of the component constraint graph data The order data generator 105 selects as a selected graph one of the component constraint graph data which has a shortest route length. The route length of the selected graph is used as the shortest route length of the component number 32 at that end. The component constraint graph data are added to the shortest route. In the present specification, the component number 32 at that node (branch-side node) will be called a selected component. The order data generator 105 memorizes a set of data required to reproduce in a later step S216 the original data state before selection of the selected graph and calculation of the shortest route length.

Figure 16:
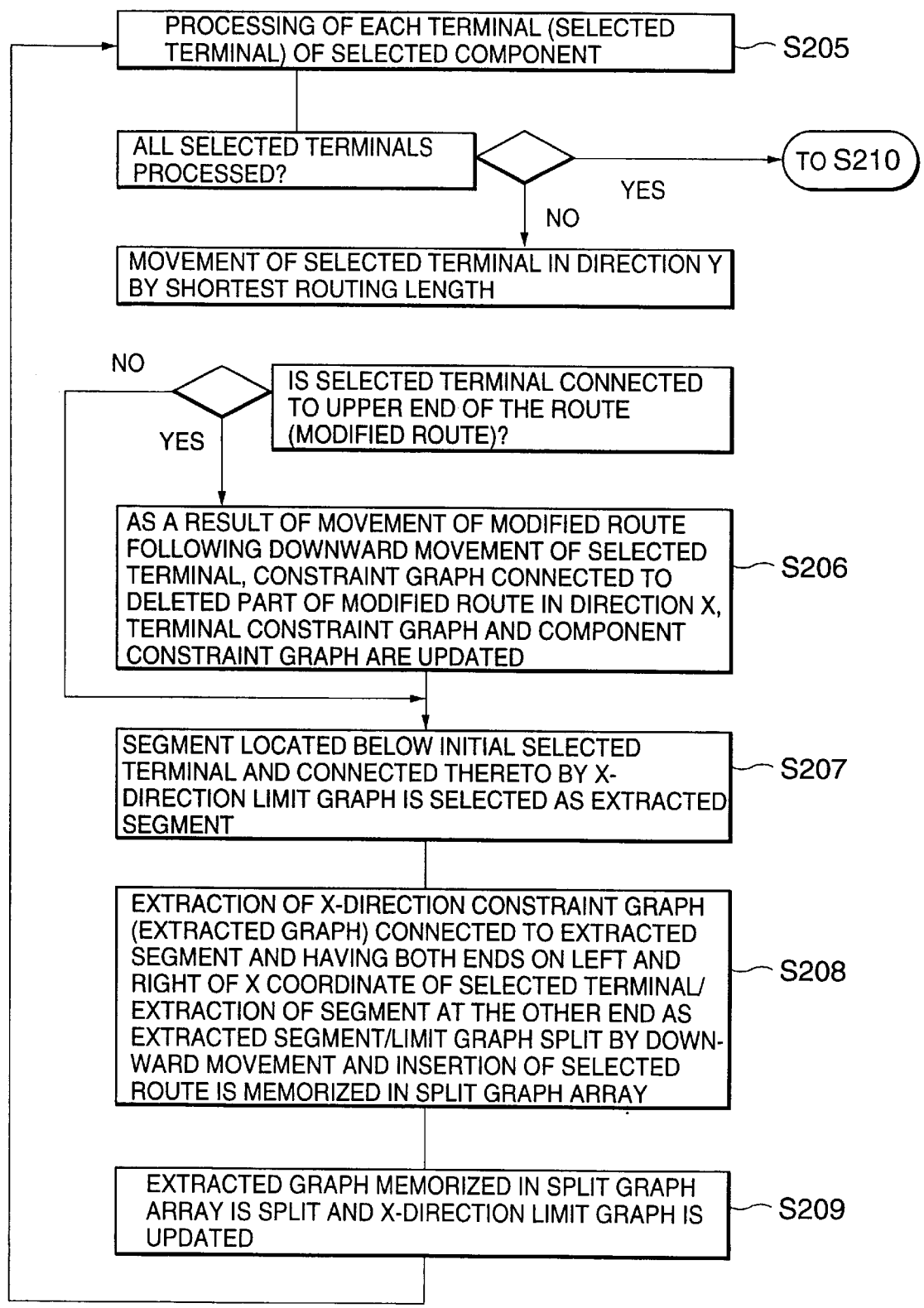
FIG. 16 is a flow chart showing in detail a part of the operation in FIG. 15.

Turning to FIG. 16, in a step S205, the component compactor 107 extracts as selected terminals respective terminals of the selected component. The selected terminals are successively moved in the direction X by the shortest route length and located at appropriate positions. Then, the operation proceeds to a following step S206. When all of the selected terminals of the selected component are processed, the operation proceeds to a step S210.

Figure 19A:
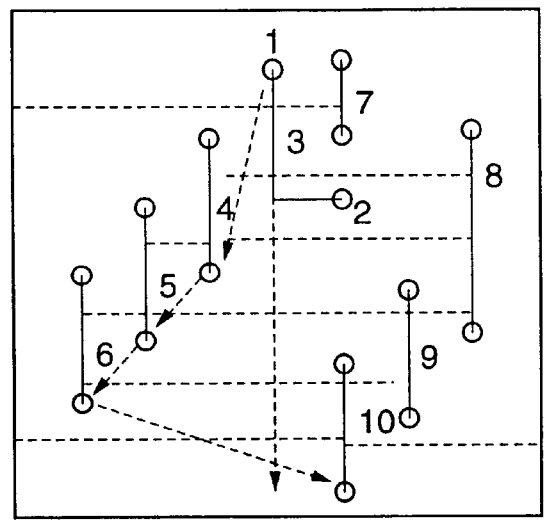
FIGS. 19A through 19C are views for describing the operation of the graphic layout compaction system illustrated in FIG. 14.
Figure 19B:
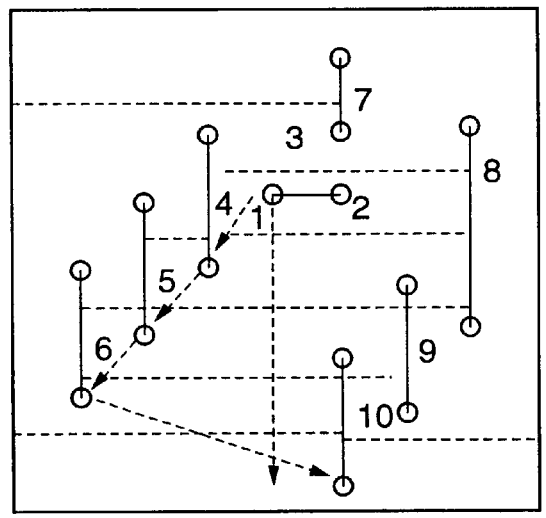

In case where the route segment number 31 is connected at the upper end to the selected terminal before movement, like a wire 3 connected to a terminal 1 in FIG. 19A, the operation proceeds to the step S206. Otherwise, the operation proceeds to a step S207. In the step S206, the constraint graph updating unit 112 calculates, with respect to the segment numbers 31 connected by the X-direction constraint graph data on the left and the right to the modified route segment before movement, whether or not the adjacency in the direction x is cancelled as a result of the downward movement of the modified route segment in the direction Y (the movement within a range such that upper and lower ends of the modified route segment are not reversed by the movement of the selected terminal. For example, as a result of the movement of the terminal 1 in the layout illustrated in FIG. 19A, the adjacency represented by the X-direction constraint graph data is cancelled for the routes 3 and 7, the routes 3 and 4, and the routes 3 and 8, as illustrated in FIG. 19B. The constraint graph updating unit 112 erases the X-direction constraint graph data for which the adjacency is cancelled as described above. In FIG. 19B, a new adjacency is created for the routes 4 and 8. The constraint graph updating unit 112 calculates whether or not a new adjacency is produced for those segment numbers 31 outside of the erased constraint graph data to prepare new constraint graph data representative of the new adjacency.

The constraint graph updating unit 112 calculates, with respect to the X-direction terminal constraint graph data including the modified route segment number 31, the width of the routing zones at both ends of the terminal constraint graph data by the use of the result of modification of the modified route segment to update the recorded value. The routing zone is added to the lefthand terminal in the direction X to calculate the routing restraint area. Likewise, the routing restraint area is calculated with respect to the righthand terminal. Then, calculation is made of overlapping of the Y-coordinate widths of the routing restraint area. When the overlapping is cancelled, the constraint graph updating unit 112 deletes the X-direction terminal constraint graph data. If not deleted, the relative movement lout length 62 in the direction X is updated. Then, the operation proceeds to the step S207.

In the step S207, the constraint graph updating unit 112 extracts the segment numbers 31 (adjacent segments), such as the routes 7, 4, and 8 in FIG. 19A, connected by the X-direction constraint graph data to the selected terminal and the modified route segment, such as the terminal 1 and the route 3 in FIG. 19A. Among these adjacent segments, the segment numbers 31 of the segments, such as the routes 4 and 8, having lower ends lower than the selected terminal and the lower end of the modified wire segment are extracted as first extracted segments.

Next, in a step S208, the constraint graph updating unit 112 extracts, among the X-direction constraint graph data connected to the extracted segments, the X-direction constraint graph data (between the routes 4 and 8, for example) meeting the following conditions:

(1) The X coordinate of the selected terminal is interposed between the X coordinates of the segment numbers 31 (third segment) at both ends of the X-direction constraint graph data.

(2) The uppermost ends of the segments at both ends are located above the lowermost end of the selected terminal after the downward movement in the direction Y.

(3) The X-direction constraint graph data overlap the track of the movement of the selected terminal.

The X-direction constraint graph data thus extracted are called an extracted graph. The constraint graph updating unit 112 deletes those of a plurality of the extracted segments which are not connected to the extracted graph.

Figure 19C:
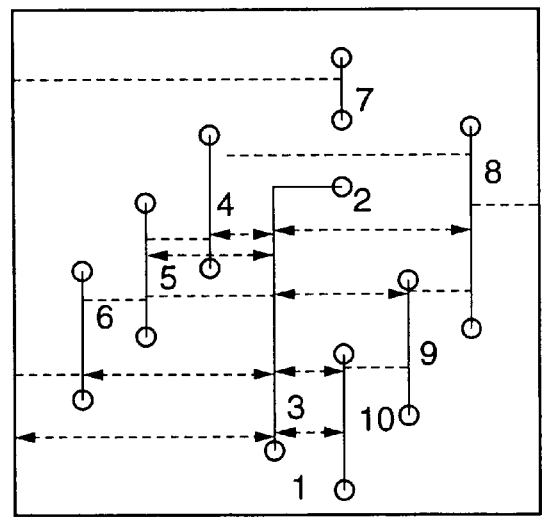

Next, the constraint graph updating section 112 extracts the segment numbers 31 connected by the X-direction constraint graph data to the extracted segment, like the route 5 (FIG. 19A) connected to the route 4 as the extracted segment (except those already selected as the extracted segments). Among those segment numbers 31, the segment having an upper end lower than the upper end of the extracted segment connected thereto is added as a new extracted segment. The constraint graph updating unit 112 successively extracts extracted graphs connected to the new extracted segments, such as the routes 5 and 9 and the routes 6 and 10. At this time, the constraint graph updating unit 112 memorizes the extracted graph in a split graph array when the lower end of the modified route segment is connected to the selected terminal by the movement of the selected terminal, as the lower end of the route 3 is connected to the terminal 1 in FIG. 19C. Thus, the extracted segments and the extracted graphs are successively extracted. If any new extracted segment no longer exists, the operation proceeds to a step S209.

In the step S209, the constraint graph updating unit 112 reads the extracted graph from the split graph array and prepares X-direction constraint graph data recording the segment numbers 31 at the both ends and the modified route segment. The constraint graph updating unit 112 calculates the adjacency of the selected terminal after the movement and the segment number(s) 31 of the extracted graph in the direction X. In presence of the adjacency, the X-direction constraint graph data recording the selected terminal and the segment number(s) 31 are prepared.

The constraint graph updating unit 112 erases the constraint graph data if the adjacency of the segment numbers 31 at both ends of the extracted graph in the direction X is prevented by insertion of the modified route segment.

The constraint graph updating unit 112 updates the X-direction constraint graph order data by modification of the modified route segment. Then, the operation returns to the step S205.

Figure 17:
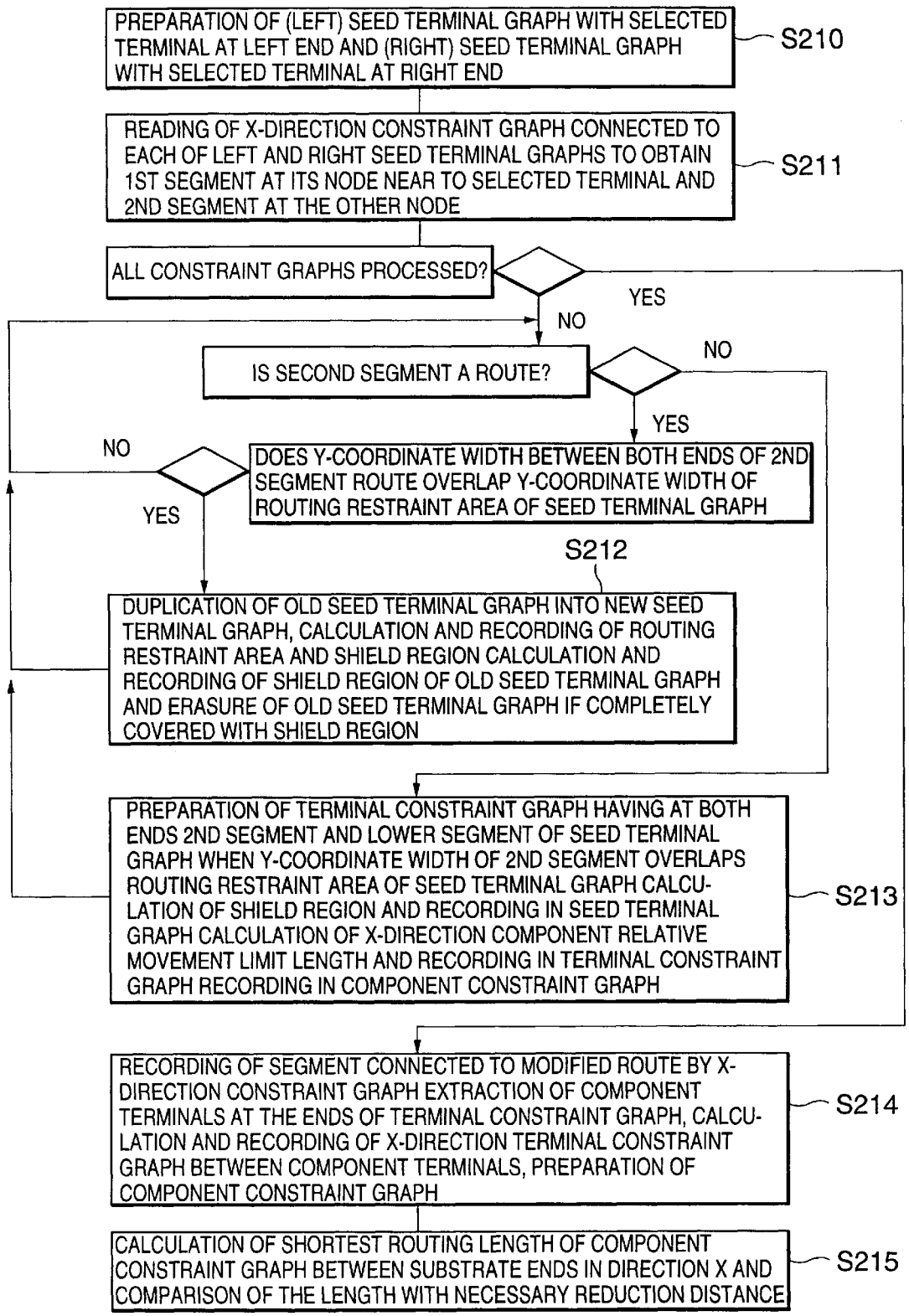
FIG. 17 is a flow chart showing in detail another part of the operation in FIG. 15.
Figure 18:
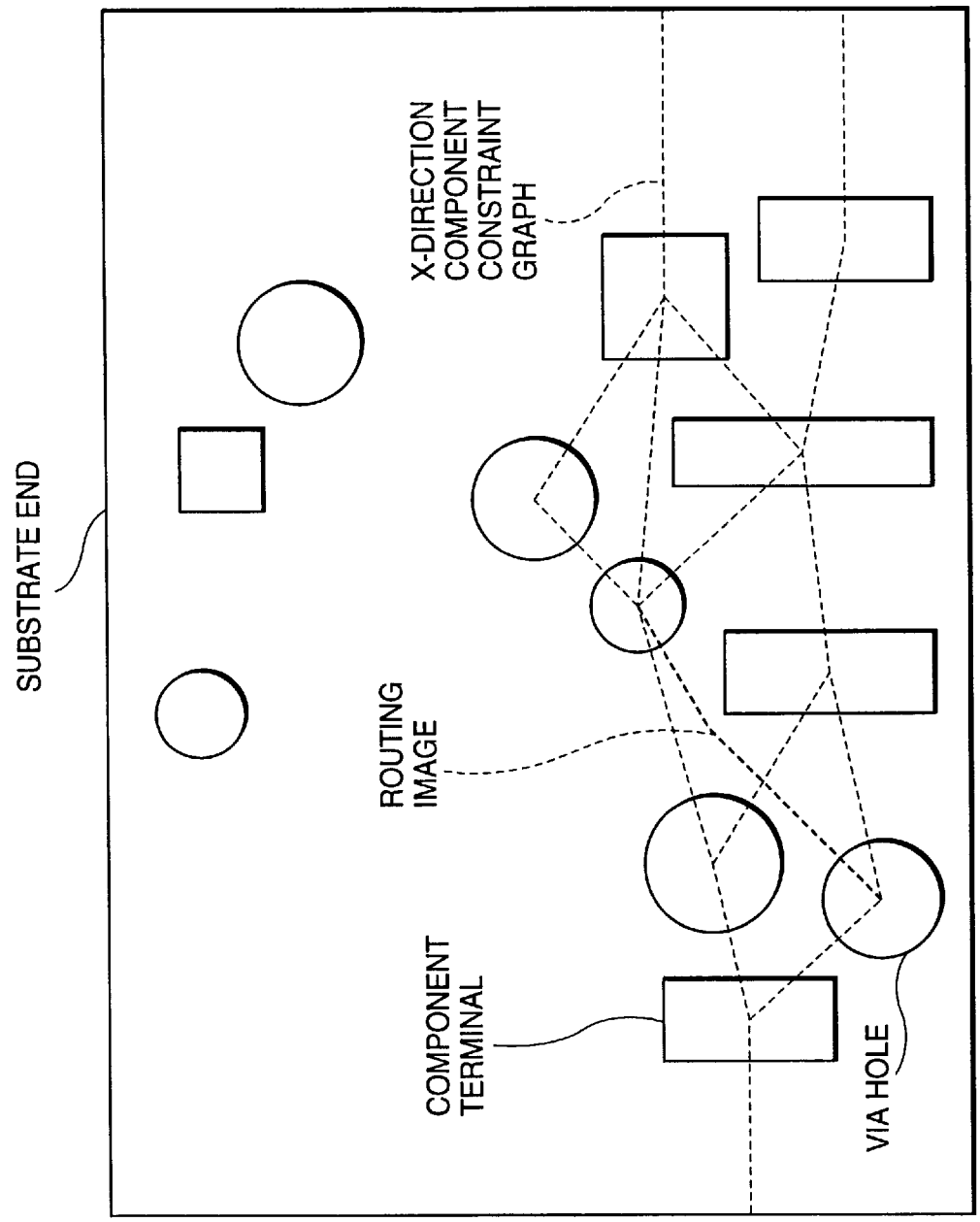
FIG. 18 is a plan view for describing the operation of the graphic layout compaction system illustrated in FIG. 14.

Referring to FIGS. 17, the terminal constraint graph generator 104 prepares, for each selected terminal moved in the direction Y, the terminal constraint graph data connected thereto in the direction X and the component constraint graph data (steps S210 through S213).

At first in the step S210, the terminal constraint graph generator 104 prepares (left) seed terminal graph data 53 recording the selected terminal at a left end and (right) seed terminal graph data 53 recording the selected terminal at a right end. The terminal constraint graph generator 104 calculates the Y-coordinate width of the routing restraint area of an octagonal configuration surrounding the selected terminal and having eight sides spaced at a necessary gap from the contour of the selected terminal in eight directions (opposite directions in longitudinal, transversal, first and second diagonal directions). The calculated width is memorized in the seed terminal graph data 53.

Then, in the step S211, the terminal constraint graph generator 104 reads, for each of the (left and right) seed terminal graph data 53, the constraint graph data connected to the selected terminal in the order memorized in the X-direction constraint graph order data (from right to left) to obtain the segment numbers 31 recorded by the constraint graph data. The segments near to and remote from the selected terminal are called first and second segments. When the first segment is recorded in the seed terminal graph data 53, the operation proceeds to the steps S212 and S213 if the second segment is a wire and a component terminal, respectively. When the first segment is not recorded in the seed terminal graph data 53, the terminal constraint graph generator 104 further reads the X-direction constraint graph data and performs similar processing. When all of the seed terminal graph data 53 have been processed, the operation proceeds to the step S214.

In the step S212, the terminal constraint graph generator 104 duplicates, if the second segment is a route and if the Y-coordinate width between both ends of the route overlaps the Y-coordinate width of the routing restraint area of the seed terminal graph data 53, the seed terminal graph data 53 into new seed terminal graph data 53. The new data are recorded with the segment number 31 of the second segment added thereto. In addition, the routing width of the second segment and the necessary gap are added to the routing restraint area width of the old data to calculate a new routing restraint area width to be recorded. The routing width of the second segment and the necessary gap are added to the shield region width of the old data to calculate a new shield region width to be recorded. In the old data, the terminal constraint graph generator 104 records the Y-coordinate width of the second segment as the shield region width. When the routing restraint area of the seed terminal graph data 53 is completely covered with the shield region, the seed terminal graph data 53 are erased. Then, the operation returns to the step S211.

In the step S213, the terminal constraint graph generator 104 records, if the second segment is a component terminal and if the Y-coordinate width of the second segment overlaps the Y-coordinate width of the routing restraint area of the seed terminal graph data 53, the second segment and the selected terminal as opposite nodes. In the manner similar to the step S1035 in FIG. 5, the terminal constraint graph generator 104 calculates the X-direction component relative movement limit length 62 and prepares the X-direction term al constraint graph data and the component constraint graph data recording the above-mentioned limit length. In the seed terminal graph data 53, the terminal constraint graph generator 104 records as the shield region width the Y-coordinate width of the component terminal segment data of the upper segment. When the routing restraint area of the seed terminal graph data 53 is completely covered with the shield region, the terminal constraint graph generator 104 erases the seed terminal graph data 53. Then, the operation returns to the step S211 to process next seed terminal graph data 53.

In the step S214, the terminal constraint graph generator 104 extracts the X-direction constraint graph data recording at the left end the segment number 31 of the modified route segment connected to the component terminal of the selected component and obtains the segment number 31 (right segment) at the right end. Then, the terminal constraint graph generator 104 extracts the X-direction terminal constraint graph data recording the right segment mentioned above and extracts the segment number 31 (right terminal) of the component terminal at the right end. The terminal constraint graph number 51 of the constraint graph data thus extracted and the segment number 31 of the right terminal are recorded in a right terminal array (not shown). Likewise, the terminal constraint graph generator extracts the X-direction constraint graph data recording the modified route segment at the right end and obtains the segment number 31 (left segment) at the left end. The terminal constraint graph generator 104 extracts the X-direction terminal constraint graph data recording the left segment mentioned above and extracts the segment number 31 (left terminal) of the component terminal at the left end. The terminal constraint graph number 51 of the constraint graph data thus extracted and the segment number 31 of the left terminal are recorded in a left terminal array (not shown).

The terminal constraint graph generator 104 combines the left and the right terminal arrays and reads the segment numbers 31 of the wires from the left terminal in the left terminal constraint graph data to the modified wire segment. The terminal constraint graph generator 104 also reads the segment numbers 31 of the routes from the right terminal in the right terminal constraint graph data to the modified route segment. The terminal constraint graph generator 104 calculates a total sum of the widths of the routes of the segment numbers 31 from the left terminals to the right terminals, the width of the modified wire segment, and the necessary gaps to obtain the routing zone width 52. When the sum of the routing zone width and the radii of the left and the right terminals in the direction Y (on confronting sides) is not smaller than the gap between the both terminals in the direction Y, the terminal constraint graph generator 104 prepares the terminal constraint graph data having the left and the right terminals at both ends. In the manner similar to the step S1036 in FIG. 5 (the first embodiment), the terminal constraint graph generator 104 calculates the component relative movement limit length 62 in the direction X and records the calculated limit length in the X-direction terminal constraint graph data and the component constraint graph data. The above-mentioned operation is performed for all combinations of the right and the left terminal arrays 72 and 73. Thereafter, the operation proceeds to the step S215.

In the step S215, among all component constraint graph data including newly prepared X-direction component constraint graph data, the terminal constraint graph generator 104 calculates a shortest route of the component constraint graph data by the use of the Dijkstra method. Specifically, the component constraint graph data giving shortest routes are successively connected from the leftmost end to the rightmost end of the board in the direction X. The shortest route length means the traveling distance over which the rightmost end of the board travels towards the leftmost end. The terminal constraint graph generator 104 compares the shortest route length with a required reduction distance of the substrate end by compaction. If the shortest route length is smaller than the required reduction distance, detection is made of a compaction neck in the direction X. In this event, the operation proceeds to the step S216. Otherwise, the operation returns to the step S204 to repeat the processing.

Turning back to FIG. 15, in the step 5216, the terminal constraint graph generator 104 calculates the terminal constraint graph data having as opposite nodes the terminal of the selected component and a terminal of the mating component connected to the terminal of the selected component by the X-direction terminal constraint graph data. Assuming that the terminals at the both ends are projected in the direction Y, calculation is made of the Y-direction traveling distance to a position where their images most approach each other with the routing zone interposed therebetween. Preparation is made of the Y-direction component constraint graph data (terminal elimination graph 43) with the above-mentioned traveling distance as the Y-direction component relative 3movement limit length 62 The terminal constraint graph generator 104 recovers the record of the Y-direction shortest route of the component constraint graph data to that before selection of the selected component in the step S204.

In the above-mentioned manner, the steps S204 through S216 illustrated in FIGS. 16 and 17 are repeated to control the compaction so that the component layout in the direction X does not deviate from the limited range. In this process, the component constraint graph data are successively recorded.

In a step S217, the component compactor 107 moves each component in the direction X by the shortest route length to arrange the component.

Then, in a step Sill, the wire compactor 108 prepares the wiring limit position data in the manner similar to the step S111 in the first embodiment.

Finally, in a step S112, the rewiring unit 109 shapes the processed wire into a trimmed configuration including diagonal parts and rearranges the processed wire outside of the routing restraint area of the routing limit position data, in the manner similar to the step S112 in the first embodiment.

Next referring to FIGS. 20A through 20C, the operation of the graphic layout compaction system according to the second embodiment will be described in detail in conjunction with a specific example.

Referring to FIG. 20A, the layout to be compacted has an initial arrangement illustrated in the figure. As a result of downward compaction, a modified arrangement illustrated in FIG. 20B is obtained. Herein, the X-direction constraint graph data of the components are limited in route length to four components. Therefore, the components 1 through 4 are moved downward while the component 5 is not. This is because, if the component 5 is moved together, the route length of the X-direction constraint graph data exceeds the limit Therefore, the component 5 is arranged in a next or second row. Then, the components 6 through 8 are moved downward to be arranged in the second row, following the component 5. At this time, the component 9 is not moved downward and arranged in a third row because, if the component 9 is added to the second row, the route length of the X-direction constraint graph data exceeds the limit. In the third row, the components 10 through 12 are arranged, following the component 9. The component 13 is left in a fourth row. In the fourth row, the components 14 through 16 are arranged.

The layout in FIG. 20B obtained by the downward compaction is further subjected to leftward compaction to obtain the layout illustrated in FIG. 20C.

The graphic layout compaction system according to the second embodiment has the following effect.

In the layout formed by the Y-direction compaction, a longest route length in the direction X can be suppressed within the limit value. Therefore, the board dimension in the direction X can be suppressed within the limited range after the X-direction compaction subsequently carried out.

This is because the graphic layout compaction system. has two functions which will presently be described.

The first function is to automatically calculate the moving positions of the components upon compaction. Specifically, preparation is made of the component constraint graph data with the length of the graph connecting the component numbers 32 as the component relative movement limit length 62 of the components at the opposite ends. Calculation is made of the shortest route length from the substrate end to the component at the node of the graph as the compaction traveling distance of the component.

The second function is to control the density of the components in the direction perpendicular to the compaction direction. Specifically, detection is made of the component resulting in shortage of the compactable distance of the board end perpendicular to the compaction direction below the required distance. Preparation of made of a terminal elimination graph 43 connecting in the compaction direction the component in question and another component adjacent thereto by the use of the component constraint graph data.

A graphic layout compaction system according to a third embodiment of this invention has a structure similar to that of the first embodiment (FIG. 3) except the computer 100 further comprises a shortest route cancelling unit which will presently be described. The shortest route cancelling unit is for cancelling, after the component compactor 107 calculates the shortest route of the component constraint graph data, the shortest route by moving the via hole in the shortest route in a shortest route cancelling direction to thereby remove the interference against the compaction.

Figure 21:
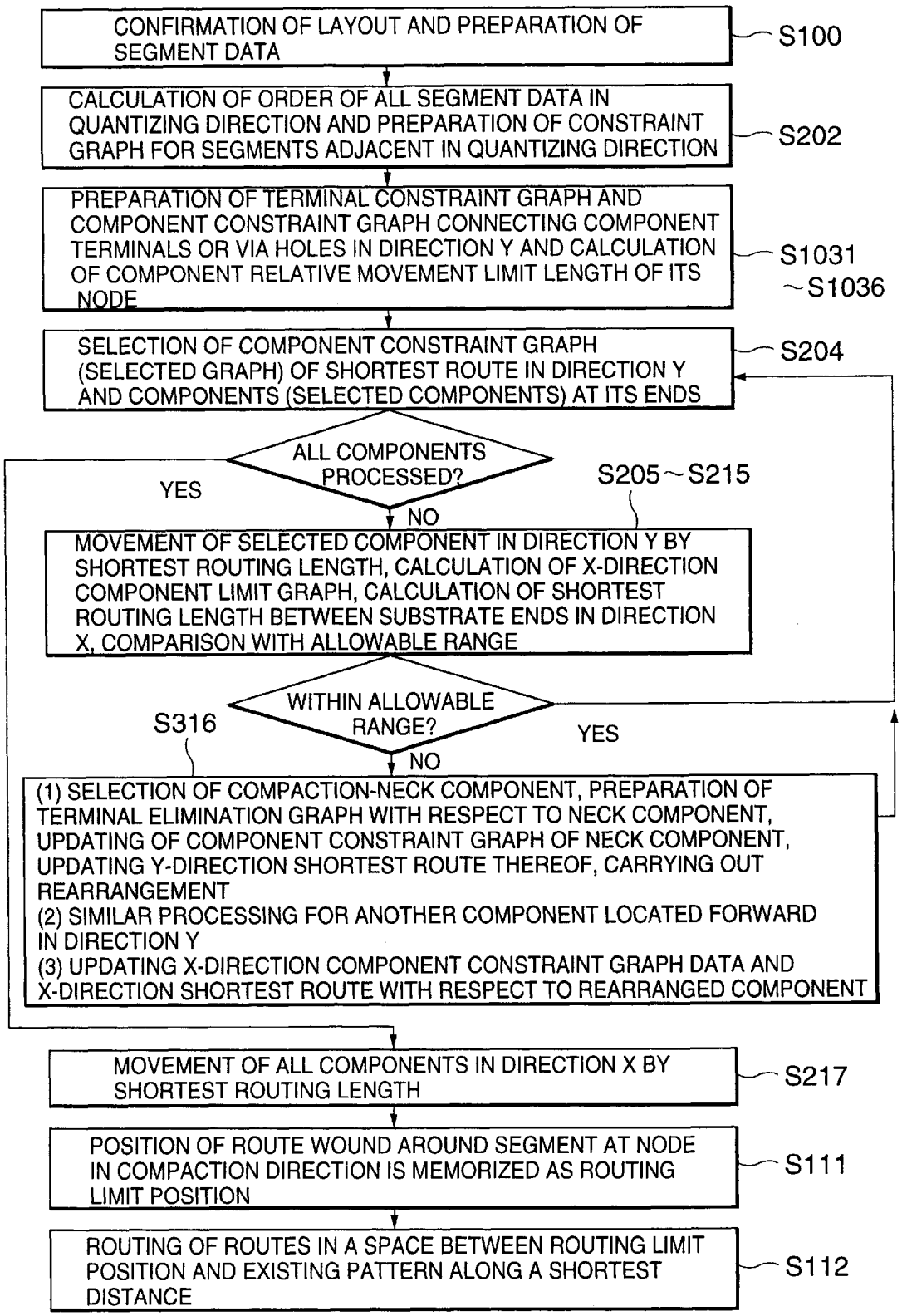
FIG. 21 is a flow chart for describing an operation of a graphic layout compaction method according to a third embodiment of this invention.

Referring to FIG. 21, the operation of the graphic layout compaction system according to the third embodiment will be described in detail.

At first in a step S100, the layout data converter 111 is supplied with the layout data and prepares the segment data, in the manner similar to the step S100 in the first embodiment.

In a step S202 following the step S100, the constraint graph generator 103 prepares the Y-direction and the X-direction constraint graph data in the manner similar to the second embodiment.

Then, through steps S1031 through S1036, the terminal constraint graph generator 104 prepares the Y-direction terminal constraint graph data and the Y-direction component constraint graph data in the manner similar to the steps S1031 through S1036 (FIG. 5) in the first embodiment.

In a step S204, the order data generator 105 selects the component constraint graph data (selected graph) of the shortest route in the direction Y and the component (selected component) at the end thereof, in the manner similar to the step S204 in the second embodiment.

In the manner similar to the steps S205 through S215 in FIGS. 16 and 17 in the second embodiment, the selected component is moved in the direction Y by the shortest route length. The component constraint graph data in the x direction is calculated. The shortest route length between the substrate ends is calculated and compared with the allowable range. If the shortest route length is not smaller than the required reduction distance in the direction X, the operation returns to the step S204 to continue the processing. Otherwise, the operation proceeds to a step S316.

In the step S316, the shortest route cancelling unit extracts, among the components at the nodes of the shortest route in the direction X, the via holes or the few-terminal components. Among the extracted components, selection is made of the component (displaced component) which is not used as the node of the shortest route of the component constraint graph in the direction T. In the following manner, the displaced component is eliminated from the shortest route of the X-direction compaction.

Specifically, the shortest route cancelling unit prepares the Y-direction terminal elimination graph 43 (component constraint graph data 60 connecting the displaced component and the component number 32 coupled to the displaced component by the X-direction component constraint graph data, in the manner similar to the first embodiment.

Next, the shortest route cancelling unit adds to the component constraint graph data the Y-direction terminal elimination graph 43 connected to the displaced component. By this addition, it is necessary to again search the shortest route of the component constraint graph data and to update the shortest route of the X-direction component constraint graph data following the change in traveling distance of the component. For this purpose, the operation returns to the step S204.

In the above-mentioned manner, the steps S204 through S316 are repeated to control the compaction so that the component layout in the direction X does not deviate from the limited range. In this process, the component constraint graph data are successively recorded.

Then, in a step S217, the component compactor 107 moves each component in the direction X by the shortest route length of the component constraint graph data to arrange the component.

Next, in a step S111, the wire compactor 108 prepares the wiring limit position data in the manner similar to the step Sill in the first embodiment.

Finally, in a step S112, the rewiring unit 109 shapes the wire into a trimmed configuration including diagonal parts and rearranges the wire, in the manner similar to the step S112 in the first embodiment.

The above-mentioned graphic layout compaction system according to the third embodiment has the following effect.

According to the third embodiment, the via hole as an obstacle against the movement of the component in the moving direction is moved in the direction perpendicular to the moving direction. Thus, the obstacle against the movement of the component is automatically cancelled to enable the movement of the component. This is because the shortest route cancelling unit serves to detect the via hole becoming the obstacle in the direction X as a result of the Y-direction compaction and to move the via hole in the direction Y.

A graphic layout compaction system according to a fourth embodiment of this invention comprises a computer 100 operated under control of a program, a display section 101, and an operating section 102, like the first embodiment (FIG. 3). In addition to the structure described in conjunction with the first embodiment, the computer 100 further comprises a component movement designating unit which will presently be described. The component movement designating unit is for setting component movement target vector data 63 (FIG. 23) designating the moving direction of each component and directed to any desired position in the layout.

Figure 22:
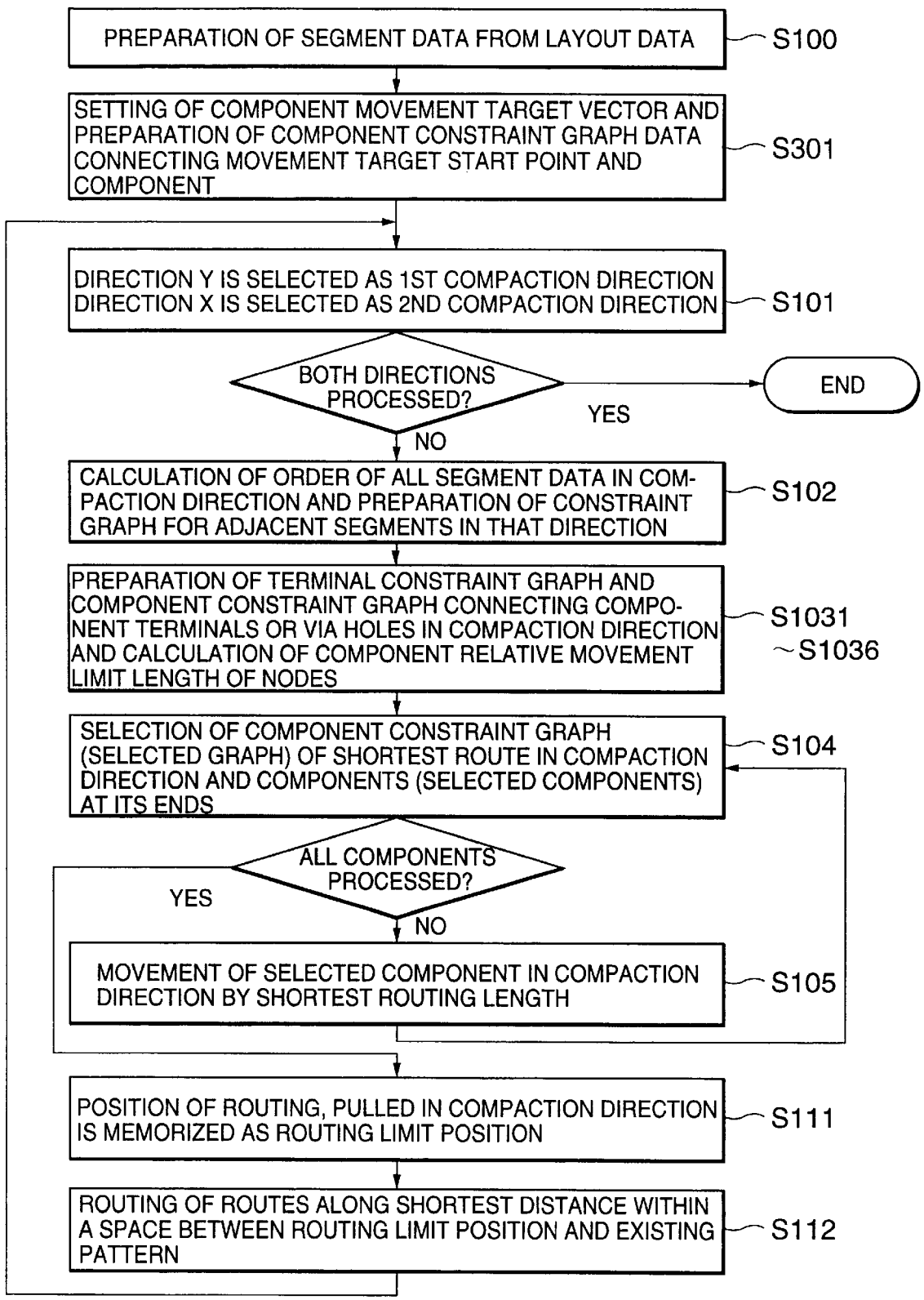
FIG. 22 is a flow chart for describing an operation of a graphic layout compaction method according to a fourth embodiment of this invention.

Next referring to FIG. 22, the operation of the graphic layout compaction system according to the fourth embodiment will be described in detail.

At first in a step S100, the layout data converter 111 is supplied with the layout data and prepares the segment data, in the manner similar to the step S100 in the first embodiment.

Then, the component movement designating unit sets the component movement target vector data 63 directing each component to a target position 630 at a desired position in the layout. Specifically, when the operator command input device 110 is supplied with an operator s command through manipulation of a mouse or a keyboard, the component movement designating unit prepares for each component the component movement target vector data 63 representative of a vector extending from its initial position to the target position 630. The component movement designating unit can read through a communication channel or from a magnetic recording medium a group of the component movement target vector data 63 for a plurality of components.

In the fourth embodiment, a fixed point to serve as a movement target start point is recorded as a node of the component constraint graph. The Y-direction component constraint graph data are prepared with the Y-direction (downward) component movement target distance used as a graph length, the movement target start point as a first node, and a component number 32 as a second node. Likewise, the X-direction component constraint graph data are prepared with the X-direction (leftward) component movement target distance used as a graph length. By preparing the component constraint graph data connecting the movement target start point and the component as described above, it is possible to move the component along the movement target vector data 63.

In the fourth embodiment, it is possible to collectively set the component movement target vector data 63 (step S301). Specifically, by collectively setting the component movement target vector data 63 to direct the moving directions of all components toward a desired layout position, the component layout can be converged. On the other hand, by collectively setting the component movement target vector data 63 to direct the moving directions reversely, the component layout can be enlarged.

Next, in the manner similar to the steps S101 through S1036 in the first embodiment, another component constraint graph data are added to the component constraint graph data connecting the movement target start point and the component number 32. Through the steps S104 and S105, the component layout is compacted by the use of the component constraint graph data.

Then, in the steps Sill and S112, the routing limit position data are calculated. In a space inside the limit position, the route is rearranged in a flexible configuration having diagonal parts.

In the fourth embodiment, it is possible to compact the layout by the operation of the second or the third embodiment after the component movement designating unit sets the component movement target vector data 63.

Next referring to FIGS. 22 through 24, the operation of the graphic layout compaction system according to the fourth embodiment will be described in conjunction with a specific example.

At first referring to FIG. 22, compaction by the graphic layout compaction system will be described with respect to the layout illustrated in FIG. 23.

Figure 23:
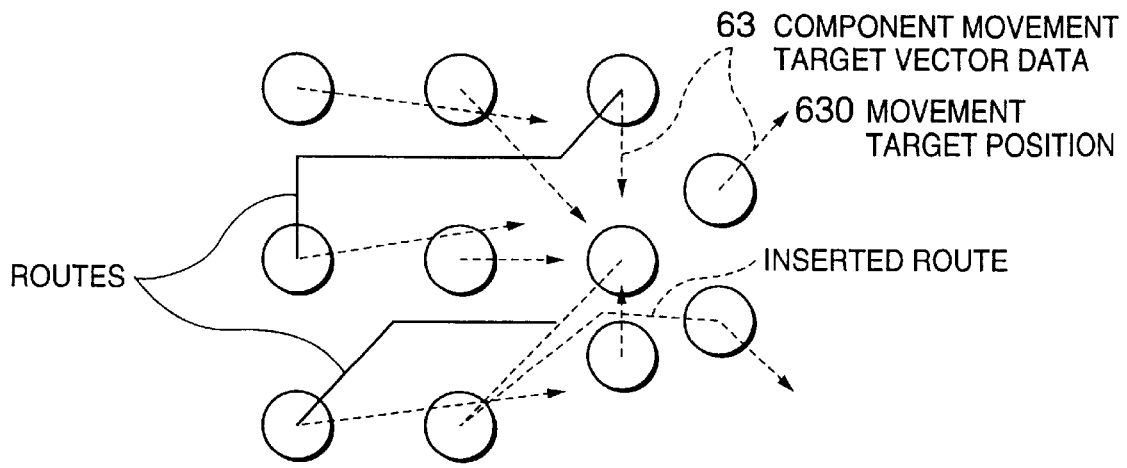
FIG. 23 is a plan view for describing the operation of the graphic layout compaction method illustrated in FIG. 22.

In response to the operator's command, the component movement designating unit designates the component movement target vector data 63 for each individual component, as illustrated in FIG. 23. Furthermore, a new route to be inserted is designated (step S301).

Figure 24:
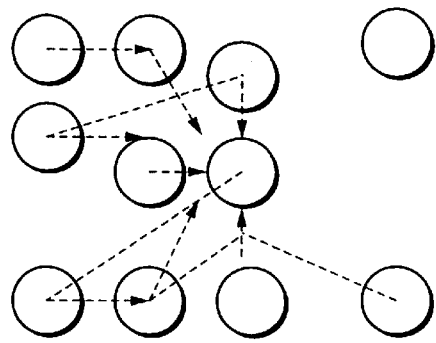
FIG. 24 is a plan view showing the layout in FIG. 23 after compaction.

As illustrated in FIG. 24, the component compactor 107 performs compaction of the arrangement. Specifically, starting from a component whose terminal has a minimum movement limit length in the direction X or Y, the components are successively moved in the direction X or Y towards the target position 630 of the movement target vector. In FIG. 24, a routing image is illustrated although the exact arrangement of routes is not yet determined at this stage.

Next, the routing compactor 108 prepares routing limit position data representative of a routing limit position. For a particular route interposed between the component terminals as the opposite nodes of the terminal constraint graph data, the routing limit position is defined along the contour of one of the component terminals in the form of an octagonal configuration. The routing limit position data are memorized in the routing limit position data memory 80 (step S111).

Figure 25:
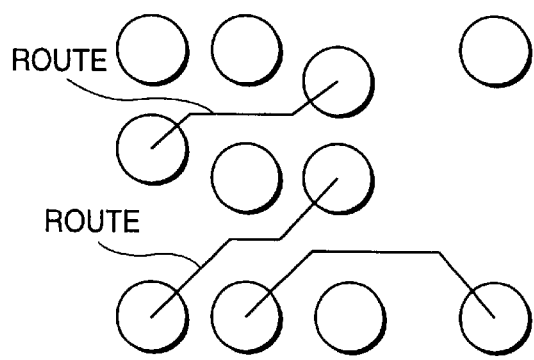
FIG. 25 is a plan view showing the layout after completion of the operation of the graphic layout compaction method illustrated in FIG. 22.

Finally, the rerouting unit 109 shapes the route into a trimmed configuration including diagonal parts and reroutes the route (step S112). The result is shown in FIG. 25.

The graphic layout compaction system according to the fourth embodiment has a principal effect as follows.

As described above, it is possible according to the fourth embodiment of this invention to move the component to any desired position. For example, it is possible to enlarge the layout of the components. This is because the fourth embodiment comprises the component movement designating unit designating the moving direction of the component by the use of a movement target position, and the component compactor 107 for moving the component towards the movement target position.

A graphic layout compaction system according to a fifth embodiment of this invention is similar to the fourth embodiment. In the fifth embodiment, the component movement designating unit sets the component movement target vector data 63 directed to enlarged positions such that the distances between the positions of all components and the center of the layout are analogously enlarged.

Then, the compaction described in the fourth embodiment is performed to obtain the layout in which the components are arranged in the enlarged positions. Thus, according to the fifth embodiment, the layout of the components can be enlarged with longitudinal and lateral orders maintained.

Next, unconnected portions between the component terminals are interconnected by an ordinary automatic routing device such as a maze router and a channel router. Alternatively, in the enlarged arrangement, the components or the interconnections are modified by manipulation on a display screen.

Then, the component movement designating unit described in the fourth embodiment sets the component movement target vector data 63 directed to compressed positions obtained by analogously compressing the distances between the positions of all components and the center of the layout.

Then, the compaction in the fourth embodiment is performed to arrange the components at the compressed positions.

The graphic layout compaction system according to the fifth embodiment has a principal effect described in the following.

In the fifth embodiment, the interconnection between the components or design modification is performed in a sufficiently wide space and thereafter the components and the routes are compacted. Therefore, high-density interconnection is readily achieved. Furthermore, the compaction in the fifth embodiment arranges the components at the positions where the longitudinal and the lateral orders are maintained Therefore, the compaction in a first direction hardly produces an obstacle against the compaction in a second direction perpendicular to the first direction.

This is because the component compactor 107 at first moves the components to widen the gap between the component and the route. In the compaction to compress the layout, the component movement target vector data 63 are designated so that the longitudinal and the lateral relationship between the components are maintained.

A graphic layout compaction system according to a sixth embodiment of this invention basically has a structure similar to that of the first embodiment except that the computer 100 further comprises a route updating unit which will presently be described. The route updating unit serves to exchange the order of a designated route and a designated component terminal or route.

Figure 26:
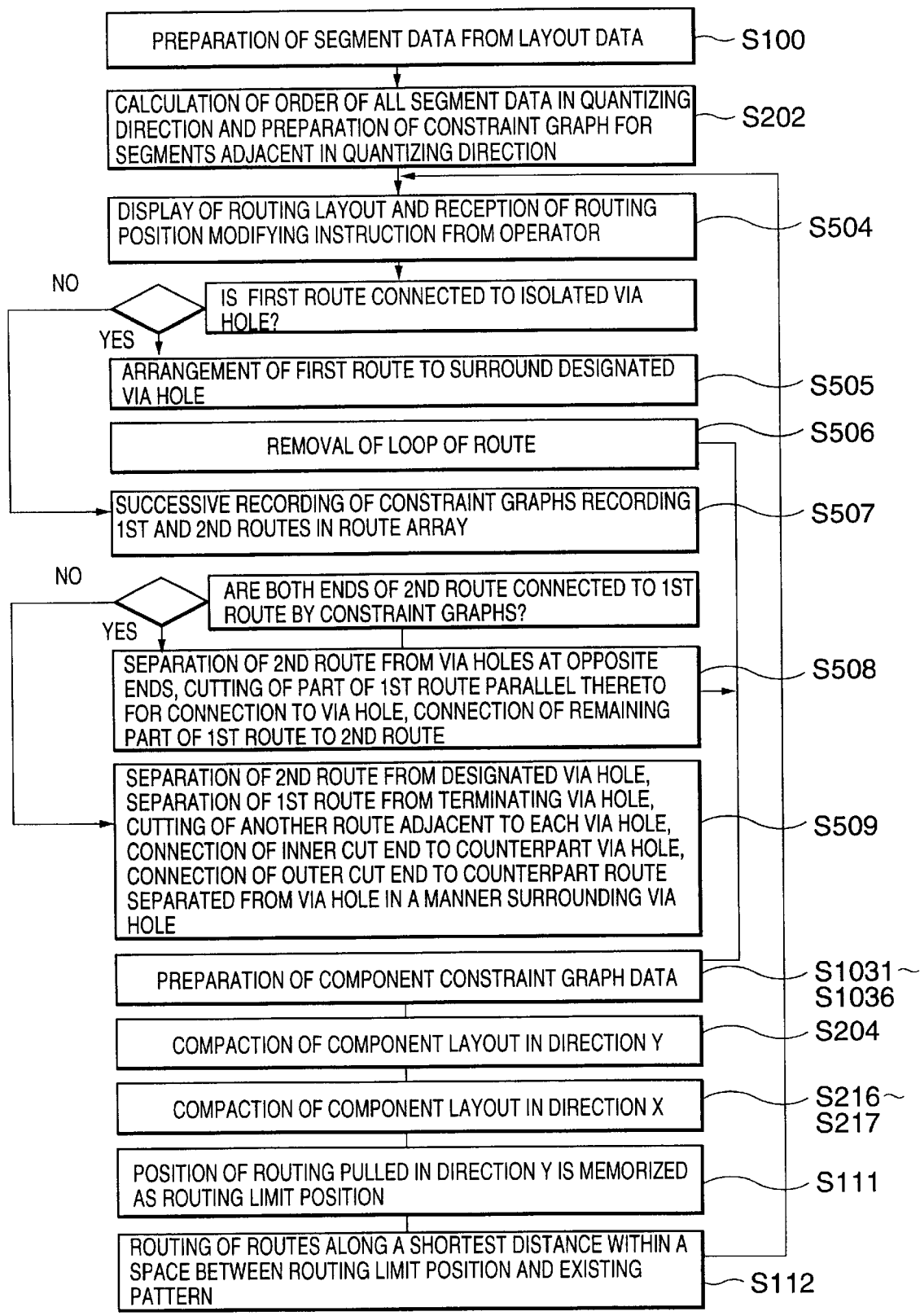
FIG. 26 is a flow chart for describing an operation of a graphic layout compaction method according to a fifth embodiment of this invention.

Referring to FIG. 26, the operation of the graphic layout compaction system according to the sixth embodiment will be described in detail.

At first in a step S100, the layout data converter Ill is supplied with the layout data and prepares the segment data, in the manner similar to the step S100 in the first embodiment.

Next, in the manner similar to the step S202 in the second embodiment, the constraint graph generator 103 prepares the Y-direction constraint graph data and the X-direction constraint graph data.

Figure 27A:
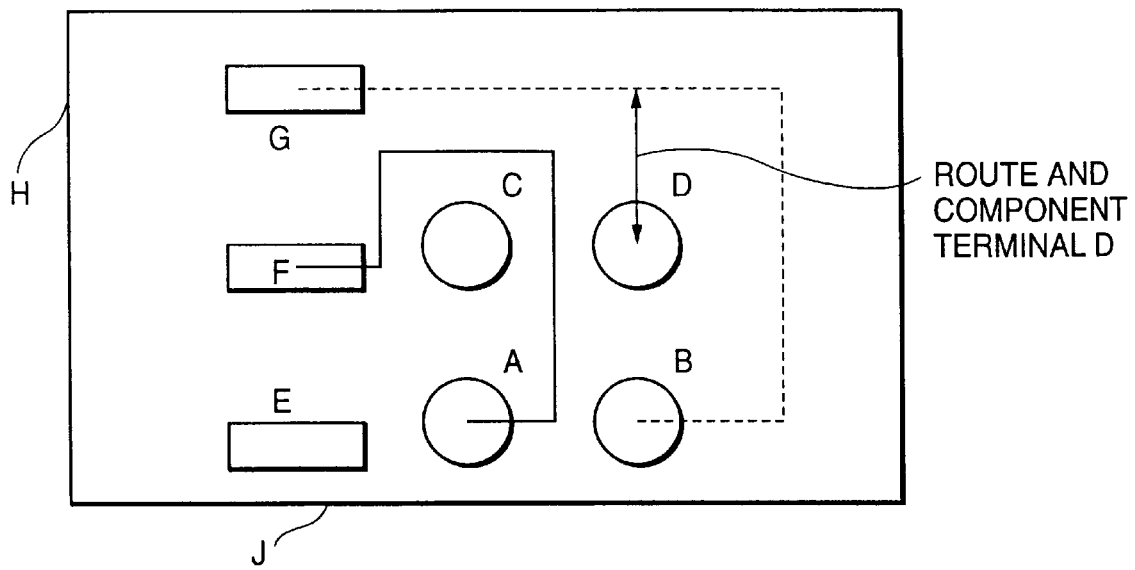
FIGS. 27A and 27B are views for describing the operation of the graphic layout compaction method in FIG. 26.

Then, in a step S504, the instruction input device 110 displays the layout of the routes and, in response to an operator's command, designate a via hole D (designated via hole) and a route adjacent thereto, as illustrated in FIG. 27A.

Figure 27B:
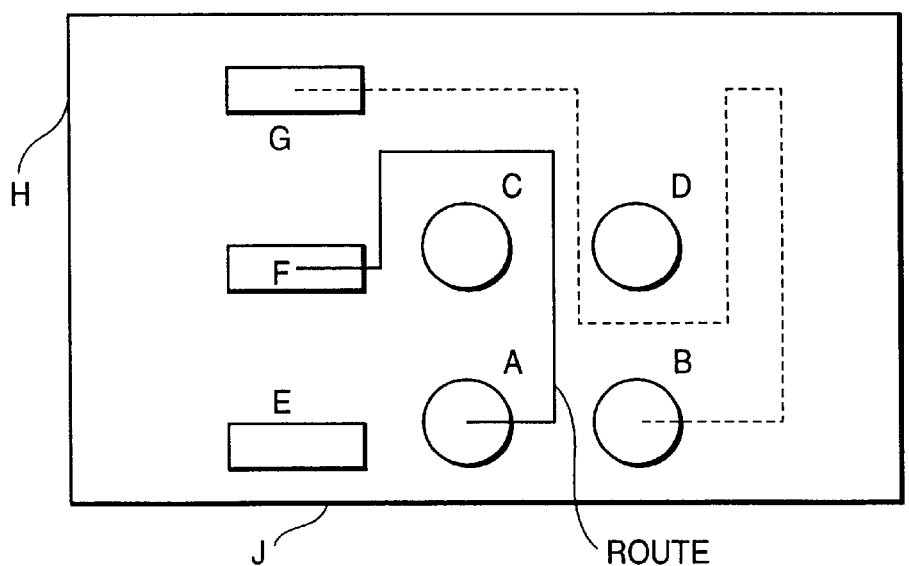

Next, the route updating unit arranges the route (first route) to surround the designated via hole, as illustrated in FIG. 27B.

Specifically, the route updating unit extracts the designated via hole and the segment number 31 connected thereto by the constraint graph data in a layer plane where the first route is present. In addition, the segment number 31 connected to the first route by the constraint graph data is extracted. The route updating unit modifies the first route into a configuration surrounding the designated via hole as illustrated in FIG. 27B within a space between the segments thus extracted. Herein, it is not essential to satisfy the required gap from the segments therearound. Thus, the segment data of the route are updated The constraint graph generator 103 prepares new constraint graph data recording the segment number 31 of the route in that route and the segment number 31 of an adjacent segment adjacent thereto in the direction X or Y (step S505).

Then, in the following manner, the route updating unit removes a loop of the route. Specifically, when the one of the position numbers 33 recorded in the segment data indicative of the surrounding route is shared only by the route segment (adjacent segment) adjacent thereto via the constraint graph data, the route updating unit alters the position number 33 (shared position) into the position number 33 at the other end of the segment data connected thereto. Then, the route updating unit calculates, by the use of the existing constraint graph data recording the route segment number 31 with the position number 33 at one end modified as mentioned above and another segment number 31, whether or not the both segment numbers 31 interferes with each other in the direction Y. If the both segment numbers 31 no longer interfere, the route updating unit deletes the constraint graph data (step S506).

Figure 28A:
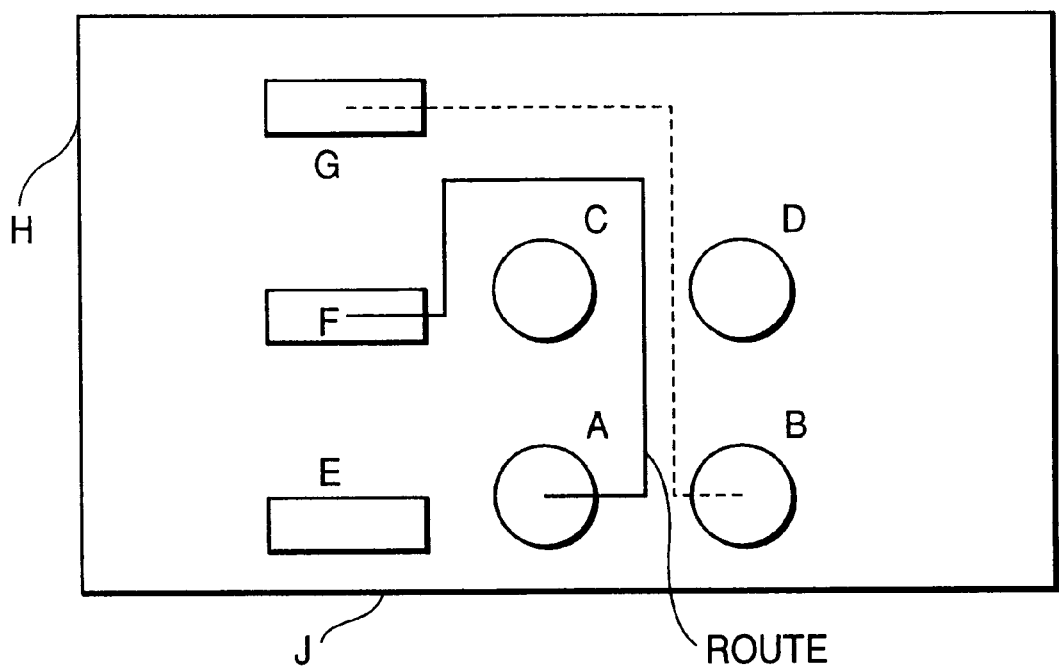
FIGS. 28A and 28B are views for describing the operation of the graphic layout compaction method in FIG. 26.

Thus, as illustrated in FIG. 28A, the route surrounding the via hole is formed.

Figure 29A:
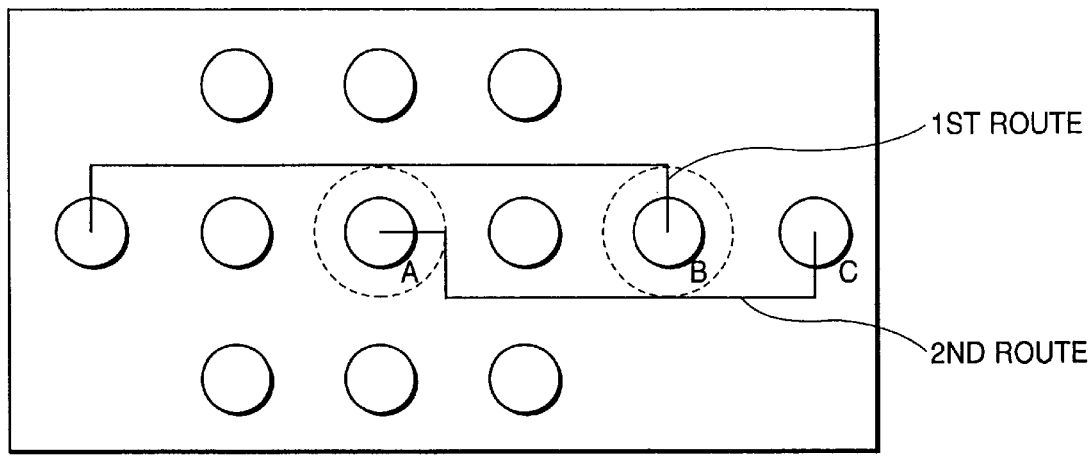
FIGS. 29A and 29B are views for describing the operation of the graphic layout compaction method in FIG. 26.

Referring to FIG. 29A, a via hole A is a designated via hole to be changed in relative position with the first route. The designated via hole A is connected to another route (second route) on the layer plane where the first route is present. In a range in which the second route runs in parallel to the first route in the direction X, each of the first and the second routes forms a single continuous line without any branch. One ends of the first and the second routes within the above-mentioned range are connected to the via holes B and A, respectively. In this event, the route updating unit changes the positions of the first and the second routes in the following manner.

Specifically, the route updating unit extracts the constraint graph data (first constraint graphs) recording the segment number 31 of the first route. The constraint graph numbers 41 are memorized in a first route array (not shown) in the order from the designated via hole A to the component terminal (via hole B) at the terminating end of the first route. The route updating unit memorizes the segment number 31 of the component terminal (via hole B) connected to the terminating end of the first route.

Then, the route updating unit extracts the constraint graph data (second constraint graphs) recording the segment number 31 of the second route. The constraint graph numbers 41 are memorized in a second route array (not shown) in the order from the designated via hole A at the top end of the second route to the via hole (component terminal C) at the terminating end. The route updating unit memorizes the segment number 31 of the via hole (component terminal C) represented by the position number 33 indicative of the terminating end of the second route (step S507).

Next, the route updating unit compares the first route array and the second route array. In case where both of the first and the last constraint graph numbers 41 in the second route array are recorded in the first route array, the start end and the terminating end of the second route are covered with the first route. In this case, the route updating unit changes the order of the first and the second routes in the following manner.

Specifically, the route updating unit deletes a part of the second route, i.e. the segment data of the second route directly coupled to the via holes at the both ends to separate the route configuration from the via holes. The route updating unit deletes those portions of the first route which are adjacent to the via holes in the direction Y to separate the route configuration. The route updating unit prepares a route configuration such that the portion of the first route between the via holes is coupled to the second via holes. The route updating unit prepares another route configuration such that the portions of the first route left on the both sides outward of the via holes are connected to the portion of the second route left between the via holes. The route updating unit updates the constraint graph data between each of the segment numbers 31 of these routes and a surrounding segment number 31 adjacent thereto in the direction X or Y. Next, the route updating unit executes the step S506 upon the first route to remove the loop of the route (step S508).

Figure 29B:
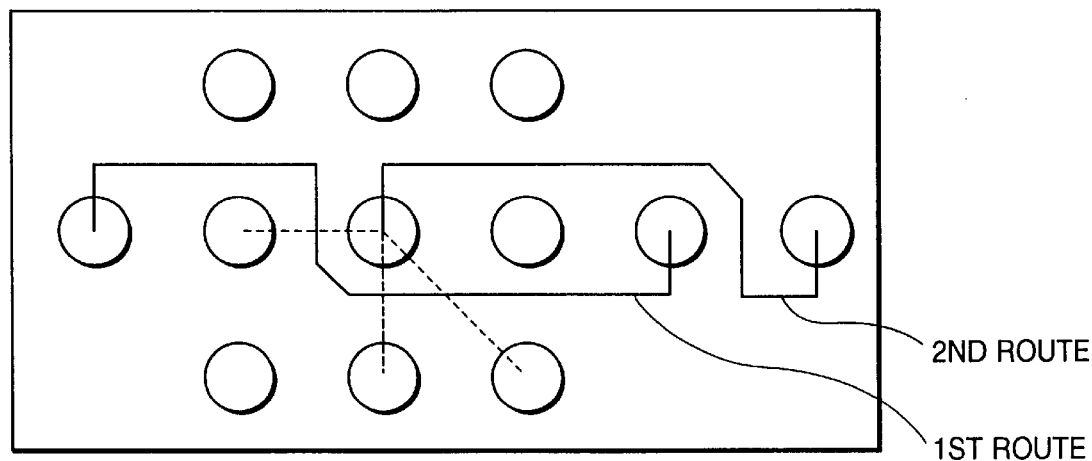

In case where the first constraint graph number of the second route array is recorded in the first route array and the last. constraint graph number of the first route array is recorded in the second route array, the second and the first routes partly run in parallel to each other as illustrated in FIG. 29A. In this case, the route updating unit changes the order of the second and the first routes as illustrated in FIG. 29B, in the manner which will hereafter be described.

Specifically, the route updating unit removes a part of the second route that is coupled to the designated via hole to divide the route configuration of the second route. The route updating unit removes a part of the first route that is coupled to the terminating via hole on the right side to divide the route configuration. The route updating unit removes parts of the first and the second routes which are adjacent to both of the via holes in the direction Y to divide the route configurations. The route updating unit connects the left end of a part of the first route between both via holes to the designated via hole, and connects the right end to a separated part of the second route on the right side of the via hole at the terminating end. The route updating unit couples the left end of a separated part of the second route between the both via holes to a separated part of the first route on the left side of the designated via hole, and connects the right end of the part of the second route to the via hole at the terminating end. The route updating unit prepares new constraint graph data between each of the segment numbers 31 of these routes and a surrounding segment number 31 adjacent thereto in the direction X or Y. Next, the route updating unit executes the step S506 upon the first route to remove the loop of the route (step S509).

In the above-mentioned manner, the first and the second routes are changed in the order of arrangement.

Then, the terminal constraint graph generator 104 prepares the component constraint graph data via the processing similar to the steps S1031 through S1036 (FIG. 5) described in conjunction with the second embodiment.

Next, in the manner similar to the steps S204 through S216 (FIGS. 15 through 17) described in conjunction with the second embodiment, the component compactor 107 executes the compaction in the direction Y on the basis of the component constraint graph data. Then, in the step S217, the compaction in the direction Y is carried out.

The route compactor 108 and the rewiring unit 109 calculate the wiring limit position data and rearranges the route in a flexible configuration including diagonal lines, in the manner similar to the steps S111 and S112 described in conjunction with the first embodiment.

Figure 28B:
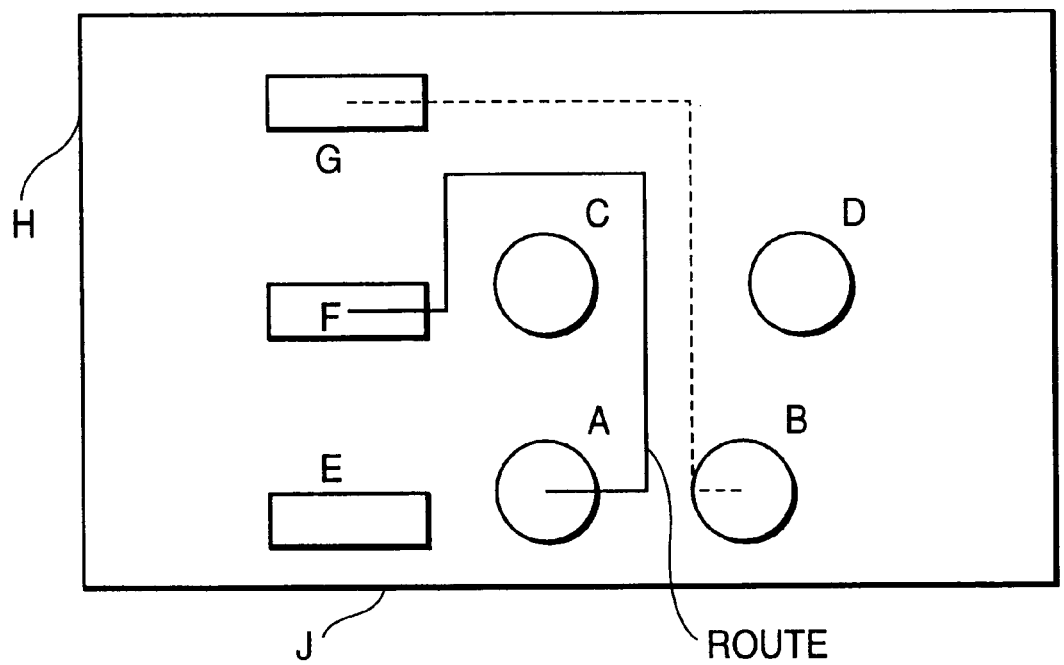

Thus, the layout illustrated in FIG. 28A is compacted in the directions Y and X to obtain the layout in FIG. 28B in which the gaps between the routes satisfy the design rule.

The above-mentioned step S1031 and subsequent steps may be performed in the following manner. Specifically, in the manner similar to the steps S101 through S1036 in the first embodiment, the terminal constraint graph generator prepares the component constraint graph data. In the manner similar to the step S104 and S105, the component compactor 107 compacts the component layout on the basis of the component constraint graph data. Then, in the manner similar to the steps S111 and S112 in the first embodiment, the route compactor 108 calculates the route limit position data and the rewiring unit 109 rearranges the route into a flexible configuration including diagonal lines.

Thus, the layout illustrated in FIG. 28A is compacted in the direction Y. Furthermore, the processing from the step S101 is repeated to carry out the compaction in the direction X to obtain the layout in which gaps between the routes satisfy the design rule.

A main effect of the graphic layout compaction system according to the sixth embodiment is as follows.

In the sixth embodiment, the layout is modified so that the routes are arranged to surround the component terminal and the relationship (order) between the routes is changed. Then, the modified layout is compacted. It is thus possible to obtain the layout in which the routes are shaped and the design rule is met.

It will readily be understood that this invention is not restricted to the foregoing embodiments and various modifications can be made within the scope of this invention. For example, the program for achieving various functions of the computer 100 may be recorded in a recording medium 115 depicted by a broken line in FIG. 3. Herein, the term "recording medium" means a medium recording the program which can be read by the computer. Specifically, the recording medium includes a CD-ROM, a magnetic disk such as a flexible disk, and a semiconductor memory. The recording medium 115 may be a magnetic tape, a paper tape, or even a paper recording the program. In case where the recording medium 115 is a paper, the computer further comprises a reading device such as an OCR (optical character reader) and a compiler for converting characters (codes) read by the reading device into a machine language recognizable by the computer.

As described above, according to this invention, compaction of a pattern of at least one layer having routes, terminals, via holes, and polygonal conductor configurations is performed in the following manner. Supplied with the layout data, the component terminals and the via holes are divided into the segment data per each layer. the routes and the polygonal conductor configurations are divided into the segment data separated by the bending points and the branching points. The segment data coupled to each other are assigned with the common component number. The individual via holes are assigned with the individual component numbers. Per each layer plane, the terminal constraint graph data and the component constraint graph data are prepared to record the limit distance within which the component terminals adjacent in the longitudinal or the lateral direction can move towards each other with the wiring zone comprising the routes and the necessary gap interposed therebetween. The components are compacted on the basis of the component constraint graph data Thereafter, the routes are shaped and rearranged. Thus, in order to avoid the interference upon compaction of the components in the second compaction direction perpendicular to the first compaction direction, the arrangement of the component causing such interference is modified to thereby reduce the layout area.

What is claimed is:

1. A graphic layout compaction system for compacting a layout represented by layout data supplied thereto and including (a) a pattern of at least a single layer having routes, component terminals, via holes, and polygonal conductor configurations arranged in a two-dimensional space and (b) components of a printed-circuit board or semiconductor cells, said system comprising:

constraint graph data generating means supplied with said layout data for preparing constraint graph data representative of a constraint graph connecting any ones of said component terminals, said via holes, said semiconductor cells, said routes, and component contours;

terminal constraint graph generating means for preparing terminal constraint graph data representative of a terminal constraint graph having as opposite nodes any ones of said component terminals, said via holes, said semiconductor cells, and said component contours, and for calculating a movement limit distance within which one of said opposite nodes coupled by said terminal constraint graph data can move in a compaction direction towards the other node with a routing zone interposed therebetween, said routing zone having a width equal to a sum of the width of any route or routes interposed between said opposite nodes and a necessary gap;

component compacting means for moving each component or each via hole as the other node within said movement limit distance to compact the layout; and rerouting means for shaping said routes into route configurations including diagonal parts and rerouting said routes in a space between said component and said via hole.

2. A graphic layout compaction system as claimed in claim 1, wherein said constraint graph data preparing means prepares, on the assumption that segment data having a common signal name are transparent to each other, the constraint graph data connected in parallel from another segment data having a different signal name.

3. A graphic layout compaction system as claimed in claim 1, wherein a component moving distance is calculated within said movement limit distance, said component compacting means moving each component in the compaction direction in case where a shortest route length of the component constraint graph data in a direction (X) perpendicular to the compaction direction is not smaller than a required moving distance of compaction in the direction X, said component compacting means otherwise preparing component constraint graph data to remove the component from the shortest route and compacting the components on the basis of the component constraint graph data so that a shortest route between substrate ends is kept to be equal to or greater than the required moving distance.

4. A graphic layout compaction system as claimed in claim 3, further comprising constraint graph updating means for updating constraint graph data in a direction perpendicular to the compaction direction every time when the components are moved in the compaction direction.

5. A graphic layout compaction system as claimed in claim 1, further comprising:

component movement designating means for displaying the via holes, the component terminals, or the semiconductor cells to designate a movement target direction and a target distance for each component and each via hole; and component constraint graph data generating means for preparing component constraint graph data recording a component number designated to move by said component movement designating means and a movement target start point number;

said component compacting means moving all of the components and the via holes in accordance with designation of movement targets by said component movement designating means.

6. A graphic layout compaction system as claimed in claim 5, wherein said component movement designating means has means responsive to an instruction of an operator for freely setting the movement target direction of a component or a semiconductor cell and a via hole;

said component compacting means moving the component in accordance with the movement target direction.

7. A graphic layout compaction system as claimed in claim 5, wherein said component compaction means enlarges distances of all components from the layout center to analogous distances, then modifies the layout by rearrangement of the routes and modification of the components, and then compacts all components and routes towards the layout center.

8. A graphic layout compaction method of compacting a layout represented by layout data and including (a) a pattern of at least a single layer having routes, component terminals, via holes, and polygonal conductor configurations arranged in a two-dimensional space and (b) components of a printed-circuit board or semiconductor cells, said method comprising the steps of:

preparing from said layout data constraint graph data representative of a constraint graph connecting any ones of said component terminals, said via holes, said semiconductor cells, said routes, and component contours;

preparing terminal constraint graph data representative of a terminal constraint graph having as opposite nodes any ones of said component terminals, said via holes, said semiconductor cells, and said component contours;

calculating a movement limit distance within which one of said opposite nodes coupled by said terminal constraint graph data can move in a compaction direction towards the other node with a routing zone interposed therebetween, said routing zone having a width equal to a sum of the width of any route or routes interposed between said opposite nodes and a necessary gap;

moving each component or each via hole as the other node within said movement limit distance to compact the layout; and shaping said routes into route configurations including diagonal parts and rerouting said routes in a space between said component and said via hole.

9. A graphic layout compaction method as claimed in claim 8, wherein the step of preparing said constraint graph data includes preparation of, on the assumption that segment data having a common signal name are transparent to each other, the constraint graph data connected in parallel from another segment data having a different signal name.

10. A graphic layout compaction method as claimed in claim 8, wherein the step of compacting the components includes calculation of a component moving distance within said movement limit distance, movement of each component in the compaction direction in case where a shortest route length of the component constraint graph data in a direction (X) perpendicular to the compaction direction is not smaller than a required moving distance of compaction in the direction X, otherwise preparation of component constraint graph data to remove the component from the shortest route and compaction of the components on the basis of the component constraint graph data so that a shortest route between substrate ends is kept to be equal to or greater than the required moving distance.

11. A graphic layout compaction method as claimed in claim 10, further comprising the step of updating constraint graph data in a direction perpendicular to the compaction direction every time when the components are moved in the compaction direction.

12. A graphic layout compaction method as claimed in any one of claim 8, further comprising the steps of:
  displaying the via holes, the component terminals, or the semiconductor cells to designate a movement target direction and a target distance for each component and each via hole; and
  preparing component constraint graph data recording a component number designated to move and a movement target start point number;
  the step of compacting each component including movement of all of the components and the via holes in accordance with designation of movement targets.

13. A graphic layout compaction method as claimed in claim 12, wherein:
  the step of designating the movement of each component includes freely setting, in response to an instruction of an operator, the movement target direction of a component or a semiconductor cell and a via hole;
  the step of compacting each component including movement of the component in accordance with the movement target direction.

14. A graphic layout compaction method as claimed in claim 12, wherein the step of compacting each component includes expansion of distances of all components from the layout center to analogous distances, modification of the layout by rearrangement of the routes and modification of the components, and compaction of all components and routes towards the layout center.

15. A recording medium readable by a computer and recording a program for making said computer execute a processing of compacting a layout represented by layout data and including (a) a pattern of at least a single layer having routes, component terminals, via holes, and polygonal conductor configurations arranged in a two-dimensional space and (b) components of a printed-circuit board or semiconductor cells, said processing including:
  a first processing of preparing from said layout data constraint graph data representative of a constraint graph connecting any ones of said component terminals, said via holes, said semiconductor cells, said routes, and component contours;
  a second processing of preparing terminal constraint graph data representative of a terminal constraint graph having as opposite nodes any ones of said component terminals, said via holes, said semiconductor cells, and said component contours;
  a third processing of calculating a movement limit distance within which one of said opposite nodes coupled by said terminal constraint graph data can move in a compaction direction towards the other node with a routing zone interposed therebetween, said routing zone having a width equal to a sum of the width of any route or routes interposed between said opposite nodes and a necessary gap;
  a fourth processing of moving each component or each via hole as the other node within said movement limit distance to compact the layout; and
  a fifth processing of shaping said routes into route configurations including diagonal parts and rerouting said routes in a space between said component and said via hole.

16. A recording medium as claimed in claim 15, wherein said first processing includes preparation of, on the assumption that segment data having a common signal name are transparent to each other, the constraint graph data connected in parallel from another segment data having a different signal name.

17. A recording medium as claimed in claim 15, wherein said fourth processing includes calculation of a component moving distance within said movement limit distance, movement of each component in the compaction direction in case where a shortest route length of the component constraint graph data in a direction (X) perpendicular to the compaction direction is not smaller than a required moving distance of compaction in the direction X, otherwise preparation of component constraint graph data to remove the component from the shortest route and compaction of the components on the basis of the component constraint graph data so that a shortest route between substrate ends is kept to be equal to or greater than the required moving distance.

18. A recording medium as claimed in claim 17, further including a sixth processing of updating constraint graph data in a direction perpendicular to the compaction direction every time when the components are moved in the compaction direction.

19. A recording medium as claimed in any one of claims 15, further including:
  a seventh processing of displaying the via holes, the component terminals, or the semiconductor cells to designate a movement target direction and a target distance for each component and each via hole; and
  an eighth processing of preparing component constraint graph data recording a component number designated to move and a movement target start point number;
  said fourth processing including movement of all of the components and the via holes in accordance with designation of movement targets.

20. A recording medium as claimed in claim 19, wherein:
  said seventh processing includes freely setting, in response to an instruction of an operator, the movement target direction of a component or a semiconductor cell and a via hole;
  said fourth processing including movement of the component in accordance with the movement target direction.

21. A recording medium as claimed in claim 19, wherein said fourth processing includes expansion of distances of all components from the layout center to analogous distances, modification of the layout by rearrangement of the routes and modification of the components, and compaction of all components and routes towards the layout center.

22. A graphic layout compaction system for compacting a layout represented by layout data supplied thereto and including (a) a pattern of at least a single layer having routes, component terminals, via holes, and polygonal conductor configurations arranged in a two-dimensional space and (b) components of a printed-circuit board or semiconductor cells, said system comprising:

a constraint graph data generating mechanism having layout data adapted to prepare constraint graph data representative of a constraint graph connecting any one of said component terminals, said via holes, said semiconductors cells, said routes, and component contours;

a terminal constraint graph generating mechanism adapted to prepare terminal constraint graph data representative of a terminal constraint graph having as opposite nodes any one of said component terminals, said via holes, said semiconductor cells, and said component contours, and further adapted to calculate a movement limit distance within which one of said opposite nodes coupled by said terminal constraint graph data can move in a compaction direction towards the other node with a routing zone interposed therebetween, said routing zone having a width equal to a sum of the width of any route or routes interposed between said opposite nodes and a necessary gap;

a component compacting mechanism, wherein said component compacting mechanism moves each component or each via hole as the other node within said movement limit distance to compact the layout; and a rerouting mechanism, said rerouting mechanism operably configured for shaping said routes into route configurations including diagonal parts and rerouting said routes in a space between said component and said via hole.

23. A graphic layout compaction system as claimed in claim 22, wherein said constraint graph data mechanism prepares, on assumption that segment data having a common signal names are transparent to each other, the constraint graph data connected in parallel from another segment having a different signal.

24. A graphic layout compaction system as claimed in claim 22, wherein a component moving distance is calculated within said moving limit distance, said component compacting mechanism moving each component in the compaction direction in case where a shortest route length of the component constraint graph data in a direction (X) perpendicular to the compaction direction is not smaller than a required moving distance of compaction in the direction X, said component compacting mechanism otherwise preparing component constraint graph data to remove the component from the shortest route and compacting the components on the basis of the component constraint graph data so that the shortest route between substrate ends is kept equal to or greater than the required moving distance.

25. A graphic layout compaction system as claimed in claim 24, further comprising constraint graph updating mechanism adapted to update constraint graph data in a direction perpendicular to the compaction direction every time when the component are moved in the compaction direction.

26. A graphic layout compacting system as claimed in claim 22, further comprising:

component movement designating mechanism operably configured for displaying the via holes, the component terminal, or the semiconductor cells to designate a movement target direction and a target distance for each component and each via hole; and component constraint graph data generating mechanism adapted to prepare component constraint graph data recording a component number designated to move by said component movement designating mechanism and a movement target start point number;

said component comparing mechanism moving all of the components sand the via holes in accordance with designation of movement targets by said component movement designating mechanism.

27. A graphic layout compaction system as claimed in claim 26, wherein said component movement designation mechanism is operably configured to be responsive to an instruction of an operator for freely setting the movement target direction of a component or a semiconductor cell and a via hole;

said component compacting mechanism moving the component in accordance with the movement target direction.

28. A graphic layout compaction system as claimed in claim 26, wherein said component compaction mechanisms enlarged distance of all components from the layout center to analogous distances, then modifies the layout by arrangement of the routes and modification of the components, and then components, and then compacts all components and routed towards the layout center.

* * * * *

UNITED STATES PATENT AND TRADEMARK OFFICE
CERTIFICATE OF CORRECTION

PATENT NO.     : 6,385,758 B1
DATED          : May 7, 2002
INVENTOR(S)    : Hideo Kikuchi and Takeshi Shimotsu It is certified that error appears in the above-identified patent and that said Letters Patent is hereby corrected as shown below:

Column 1,
Line 42, delete "(214380/1988)" insert -- 214880/1988 --;
Line 54, delete "IEICE VID91-123" insert -- IEICE VLD91-123 --

Column 2,
Line 11, delete "Emory" insert memory --;
Line 32, delete "BO" insert -- so --

Column 3,
Line 33, delete "dimnsional" insert -- dimensional --;
Line 63, delete "V1M97-40" insert -- VLD97-40 --

Column 7,
Line 43, after "position" insert -- . --;
Line 46, delete "lint" insert -- limit --

Column 8,
Line 50, delete "plans" insert -- plane --

Column 11,
Line 46, (eq. 1) delete "-Bv<V>Bv" insert -- -Bv<V<Bv --

Column 12,
Line 5, delete "lent" insert -- limit --;
Line 44, delete "103" insert -- 108 --

Column 14,
Line 50, delete "data The" insert -- data. The --

Column 15,
Line 11, delete "x" insert -- X --

Column 18,
Line 28, delete "3movement" insert -- movement --

Column 19,
Line 8, delete "Sill" insert -- S111 --

UNITED STATES PATENT AND TRADEMARK OFFICE
CERTIFICATE OF CORRECTION

PATENT NO. : 6,385,758 B1
DATED : May 7, 2002
INVENTOR(S) : Hideo Kikuchi and Takeshi Shimotsu It is certified that error appears in the above-identified patent and that said Letters Patent is hereby corrected as shown below:

<u>Column 20,</u>
Line 37, delete "x direction" insert -- X direction --

<u>Column 21,</u>
Line 12, delete "Sill" insert -- S111 --;
Line 51, delete "operator s" insert -- operator's --

<u>Column 22,</u>
Line 24, delete "Sill" insert -- S111 --

Signed and Sealed this

Nineteenth Day of November, 2002

*Attest:*

JAMES E. ROGAN
*Attesting Officer*     *Director of the United States Patent and Trademark Office*